(12) United States Patent
Riekki et al.

(10) Patent No.: US 8,264,282 B1
(45) Date of Patent: Sep. 11, 2012

(54) AMPLIFIER

(75) Inventors: Jonne Juhani Riekki, Espoo (FI); Jari Johannes Heikkinen, Espoo (FI); Jouni Kristian Kaukovuori, Vantaa (FI)

(73) Assignee: Renesas Mobile Corporation, Toyko (JP)

( * ) Notice: Subject to any disclaimer, the term of this patent is extended or adjusted under 35 U.S.C. 154(b) by 0 days.

(21) Appl. No.: 13/271,566

(22) Filed: Oct. 12, 2011

Related U.S. Application Data

(63) Continuation-in-part of application No. 13/111,423, filed on May 19, 2011, and a continuation-in-part of application No. 13/224,430, filed on Sep. 2, 2011.

(51) Int. Cl.
*H03F 3/191* (2006.01)

(52) U.S. Cl. .......... 330/302; 330/283; 330/51; 330/260; 330/9

(58) Field of Classification Search .................. 330/302, 330/260, 51, 283, 9
See application file for complete search history.

(56) References Cited

U.S. PATENT DOCUMENTS

| | | | | |
|---|---|---|---|---|
| 6,094,084 | A * | 7/2000 | Abou-Allam et al. | 327/359 |
| 6,175,274 | B1 * | 1/2001 | Groe | 330/51 |
| 6,768,377 | B2 * | 7/2004 | Macedo | 330/51 |
| 6,933,779 | B2 | 8/2005 | Lee et al. | 330/51 |
| 6,949,979 | B2 | 9/2005 | Lu et al. | 330/305 |
| 7,084,707 | B2 | 8/2006 | Razavi et al. | 330/302 |
| 7,266,360 | B2 * | 9/2007 | Kang et al. | 455/302 |
| 7,474,158 | B1 | 1/2009 | Yim et al. | 330/311 |
| 7,495,515 | B1 * | 2/2009 | Branch et al. | 330/305 |
| 7,595,693 | B2 | 9/2009 | Wiklund | 330/282 |
| 7,622,989 | B2 | 11/2009 | Tzeng et al. | 330/126 |
| 7,633,345 | B2 | 12/2009 | Zhan | 330/295 |
| 7,656,229 | B2 * | 2/2010 | Deng et al. | 330/149 |
| 7,843,270 | B2 | 11/2010 | Li et al. | 330/295 |
| 2005/0068106 | A1 | 3/2005 | Irvine | 330/260 |
| 2010/0237947 | A1 | 9/2010 | Xiong et al. | 330/278 |
| 2010/0321113 | A1 * | 12/2010 | Kathiresan et al. | 330/278 |
| 2011/0003563 | A1 | 1/2011 | Gorbachov | 455/78 |

FOREIGN PATENT DOCUMENTS

| | | |
|---|---|---|
| CN | 101951229 | 1/2011 |

(Continued)

OTHER PUBLICATIONS

Bruccoleri, et al., "Wide-Band CMOS Low-Noise Amplifier Exploiting Thermal Noise Cancelling", IEEE Journal of Solid-State Circuits, vol. 39, No. 2, (Feb. 2004), (pp. 275-282).

(Continued)

*Primary Examiner* — Patricia Nguyen
(74) *Attorney, Agent, or Firm* — Harrington & Smith

(57) ABSTRACT

Embodiments provide a configurable low noise amplifier circuit including a gain stage coupled to the input of the low noise amplifier circuit, the low noise amplifier circuit being configurable between one of a first topology in which the low noise amplifier circuit includes a degeneration inductance whereby the low noise amplifier circuit operates as an inductively degenerated low noise amplifier, and a second topology in which the low noise amplifier circuit includes an impedance matching stage coupled to an input of the configurable low noise amplifier circuit, the output of the impedance matching stage providing an input bias voltage for the impedance matching stage, and a feedback stage coupled to an output of the impedance matching stage and a voltage source, the feedback stage providing a compensated operating voltage for the impedance matching stage.

32 Claims, 7 Drawing Sheets

FOREIGN PATENT DOCUMENTS

| | | |
|---|---|---|
| EP | 1 993 201 A1 | 11/2008 |
| JP | 2010087954 A | 4/2010 |
| KR | 101019716 B1 | 7/2010 |
| KR | 20100077726 A | 7/2010 |
| KR | 101019716 B | 3/2011 |
| WO | WO 2007/085866 A1 | 8/2007 |

OTHER PUBLICATIONS

EP Combined Search and Examination Report under Sections 17 and 18(3) issued for corresponding GB Patent Application No. GB1117607.0 mailed Jan. 27, 2012.

EP Combined Search and Examination Report under Sections 17 and 18(3) issued for corresponding GB Patent Application No. GB1117608.8 mailed Feb. 8, 2012.

Shaeffer, D.K., et al., "A 1.5-V, 1.5-GHz CMOS Low Noise Amplifier", © 1997 IEEE, pp. 745-759.

Liao, C-F., et al., "A Broadband Noise-Canceling CMOS LNA for 3.1—10.6-GHz UWB Receivers", © 2007 IEEE, pp. 329-339.

Darabi, H., et al., A 4.5-mW 900-MHz CMOS Receiver for Wireless Paging, © 2000 IEEE, pp. 1085-1096.

* cited by examiner

AMPLIFIER

CLAIM OF PRIORITY FROM COPENDING PATENT APPLICATIONS

This application is a continuation-in-part of U.S. patent application Ser. No. 13/111,423 (filed May 19, 2011) and of U.S. patent application Ser. No. 13/224,430 (filed Sep. 2, 2011) and claims benefit under 35 U.S.C. §120 and 37 CFR 1.53(b)(2) to each of those applications. This application further claims benefit under 35 U.S.C. §119(a) and 37 CFR 1.55 to UK Patent Application No. GB1108444.9 (filed May 19, 2011) and UK Patent Application No. GB1115183.4 (filed Sep. 2, 2011).

FIELD OF THE INVENTION

This invention relates to low noise amplifiers. In particular, but not exclusively, this invention relates to configurable low noise amplifier circuits.

BACKGROUND OF THE INVENTION

Radio frequency receivers can be configured to operate within a number of different radio frequency bands. For example a receiver for a mobile station (or cellular telephony device) can be configured to operate within any of the following bands: Global System for Mobile Communications (GSM), 850, 900, 1800, and/or 1900, Wideband Code Division Multiple Access (WCDMA), High Speed Packet Access (HSPA) and/or Long Term Evolution (LTE) Bands 1, 2, 3, etc. This allows a mobile station containing such a receiver to be used in different areas where varying subsets of the above radio frequency bands are supported (e.g. to enable roaming).

Receivers typically incorporate one or more Radio-Frequency Integrated Circuits (RFICs) including a Low Noise Amplifier (LNA) as the first amplifying stage in the receiver. For example, one or more LNAs are typically used to amplify the radio frequency signals gathered by an antenna, and the amplified signals generated by the LNA(s) are then used by other components in the receiver.

Receivers typically include one or more radio frequency (RF) filters located between the antenna and the LNA(s) that form the first amplifying stage of the receiver. FIG. 1 illustrates an exemplary receiver comprising an RF module 100 and antenna 130. RF module 100 comprises an RF Front End Module 132 which in turn includes one or more (up to a total of n) RF filters 110-112 that filter radio frequency signals gathered by antenna 130. RF module 100 also comprises an RFIC 134 which in turn comprises one or more (up to a total of m) LNAs 120-122 that amplify the filtered signals generated by the RF filters 110-112.

As is known from Friis' formula for noise factor, the LNA that forms the first amplifying stage of a receiver dominates the noise figure of the receiver. The LNA that forms the first stage also has a key role in determining the input impedance of the receiver. The input impedance of this LNA must be carefully matched to a certain impedance, as otherwise the performance of an RF filter (e.g. 110-112) preceding the LNA will be degraded. Additionally, an RF filter preceding the LNA will typically have a fixed frequency range which requires the inputs of the LNA to also be matched to that frequency range.

As a result, depending on the LNA structure, it may be necessary to utilize matching components external to the RFIC containing the LNA to appropriately set the input impedance and frequency range matching. However, these external matching components can be expensive, and in some cases it is preferable to use an LNA with internal matching capabilities to appropriately set its input impedance and frequency range matching.

Another measure of receiver performance is its sensitivity (reference sensitivity level), which measures the minimum detectable signal level at the receiver input. The signal quality of the received signal is typically determined by bit error rate or throughput. The sensitivity level S is determined by the equation:

$$S = -174 \text{ dBm/Hz} + 10 \log(BW) + SNR\text{min} + NF \qquad (1)$$

where −174 dBm/Hz is the available noise power density from an input source at a temperature of 290 K, BW is the channel bandwidth, $SNR_{min}$ is the required signal-to-noise ratio, and NF is the receiver noise figure. The $SNR_{min}$ depends on the targeted bit error rate and the modulation method used, for example.

The RF filter preceding the LNA that forms the first amplifying stage in a receiver may have significant insertion loss in some of the radio frequency bands within which the receiver is configured to operate. The insertion loss can cause the receiver to be less sensitive and have a higher noise figure for these radio frequency bands. Since the receiver sensitivity in these radio frequency bands is worse, the range between the transmitter and the receiver over which the receiver can operate is reduced, thus making the cellular network design more challenging and more expensive. In addition, the size of the antenna connected to the receiver may be limited due to space constraints in devices such as mobile stations, thus restricting the performance of the antenna; this is exacerbated at lower frequencies, for example below 1 GHz, where the size of an antenna tends to become larger due to the longer wavelength. The receiver capability can therefore be degraded leading to decreased link performance.

To mitigate the above effects, the LNA noise figure should be as good as possible. However, achieving good noise performance without using external matching components prior to the LNA and with low current consumption is a challenging task. Additionally, as well as the expensive and size consuming external components, the cost of the RFIC containing the LNA must also be considered. To keep the semiconductor die area of the RFIC small, the number of on-chip inductors should be kept at a minimum, because high quality inductors require significant die area and their size does not downscale along with reductions in the features widths of integrated circuits.

From the above it can be seen that there are a number of different design factors to be considered when designing an LNA, and that accommodating some or all of these factors simultaneously can prove difficult. There is therefore a need to enhance LNA design by providing improved ways of accommodating various design factors.

SUMMARY OF THE INVENTION

In a first exemplary embodiment, there is a configurable low noise amplifier circuit comprising a gain stage coupled to the input of the low noise amplifier circuit, the low noise amplifier circuit being configurable between one of:

a first topology in which the low noise amplifier circuit comprises a degeneration inductance whereby the low noise amplifier circuit operates as an inductively degenerated low noise amplifier; and a second topology in which the low noise amplifier circuit comprises:
    an impedance matching stage coupled to an input of the configurable low noise amplifier circuit, the output of the impedance matching stage providing an input bias voltage for the impedance matching stage; and
    a feedback stage coupled to an output of the impedance matching stage and a voltage source, the feedback stage providing a compensated operating voltage for the impedance matching stage.

In a second exemplary embodiment, there is a radio-frequency semiconductor integrated circuit comprising one or more configurable low noise amplifier circuits according to the first embodiment.

In a third exemplary embodiment, there is a radio-frequency module comprising one or more radio-frequency filter circuits coupled to one or more configurable low noise amplifier circuits according to the first embodiment.

In a fourth exemplary embodiment, there is a device comprising a configurable low noise amplifier circuit according to the first embodiment.

In a fifth exemplary embodiment, there is a method of manufacturing a low noise amplifier circuit according to the first embodiment.

In a sixth exemplary embodiment, there is a method of configuring a low noise amplifier circuit comprising a gain stage, the method comprising applying one of:
    a first set of one or more control signals to the circuit to configure the circuit in a first topology in which the low noise amplifier circuit comprises a degeneration inductance whereby the low noise amplifier circuit operates as an inductively degenerated low noise amplifier; or
    a second set of one or more control signals to the circuit to configure the circuit in a second topology in which the low noise amplifier circuit comprises:
        an impedance matching stage coupled to an input of the configurable low noise amplifier circuit, the output of the impedance matching stage providing an input bias voltage for the impedance matching stage; and
        a feedback stage coupled to an output of the impedance matching stage and a voltage source, the feedback stage providing a compensated operating voltage for the impedance matching stage.

Further features and advantages will become apparent from the following description of preferred embodiments, given by way of example only, which is made with reference to the accompanying drawings.

DETAILED DESCRIPTION OF THE INVENTION

Several LNA structures are known, each of these having certain benefits and drawbacks regarding their noise performance, overall cost, and input matching capabilities.

Known inductively degenerated common-source amplifier topologies typically do not provide any impedance matching internally within the LNA. This is because the size and quality of the passive components required to provide internal matching would make it technically and economically impractical to provide such components as part of the LNA. For example, high quality inductors require a larger silicon die area, and so would be impractical to include in an integrated LNA for a mobile device. This is especially true when then there are several LNAs inside a single RFIC. These topologies thus typically use external impedance matching components, i.e. components provided separately to an integrated circuit implementing the LNA, to match input impedance. For example, often an inductor is used as an external impedance matching component coupled to each of the differential inputs. One challenge is to achieve good noise performance without external matching components and with sufficient current consumption for mobile devices. The cost of a radio frequency receiver comprises the cost of a silicon area for receiver ICs, the cost of any external matching components and the cost of any printed wiring board (PWB) area. If there are multiple RFIC inputs, as for example is the case in multi-band receivers, the count of the external matching components can become high thus increasing the expense of the radio frequency receiver. For example, some receivers may use multiple LNAs, each receiving a different band of frequencies; any external component costs and silicon area requirements are increased. In addition, the number of on-chip inductors should be kept at a minimum to reduce costs.

Figure 1:
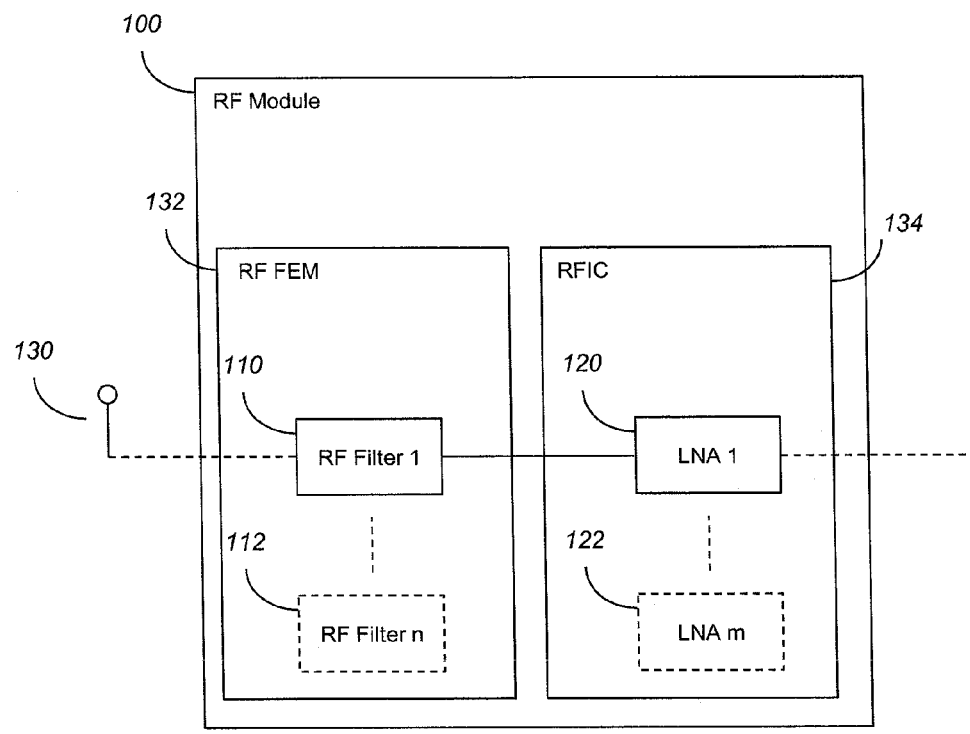
FIG. 1 illustrates a radio-frequency receiver according to the prior art.
Figure 2:
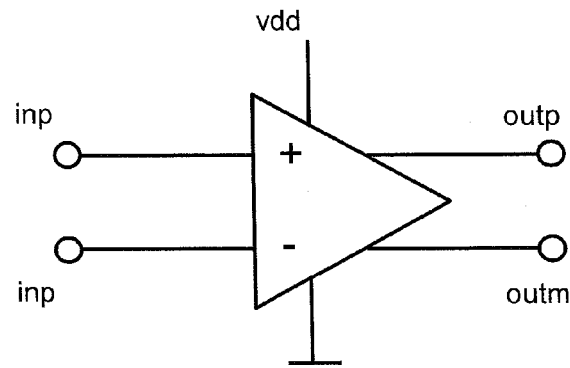
FIG. 2 illustrates a differential low noise amplifier according to the prior art.

FIG. 2 is a schematic diagram showing the inputs and outputs of a differential LNA. The LNA of FIG. 2 is an integrated differential low noise amplifier and as such has two inputs: inp and inm. For most differential signals, a signal p applied to inp will be 180 degrees out of phase with (i.e. of opposite phase to) a signal mapplied to inm. The LNA of FIG. 2 has two outputs, one for positive components of the differential signal and one for negative components of the differential signal: outp and outm. In some implementations the two outputs may be connected to provide a single output. The LNA of FIG. 2 is powered by a voltage supply vdd and is connected to ground. The voltage supply supplies a DC voltage.

A differential amplifier typically has two parts, one for a first differential signal component, e.g. p and one for a second differential signal component, e.g. m. These parts will be referred to herein as the positive or 'plus' side of the differential amplifier and the negative or 'minus' side of the differential amplifier. Each side of the differential amplifier will have a corresponding input and output, e.g. for a signal p, the p side will have input inp and output outp, likewise for a signal m, the m side will have input inm and output outp. In some embodiments the p and m sides of the differential amplifier are coupled at the outputs, for example via a configurable load such as a centre-tap differential inductor device with mutual coupling.

Even though some embodiments will be described below with regard to a differential amplifier, the embodiments may also be applied to amplifiers for single-ended signals. In single-ended embodiments, only the features of one side of the differential amplifier may be supplied.

A known LNA topology is the inductively degenerated LNA topology, a detailed analysis of which has been given in, for example, in D. K. Shaeffer and T. H. Lee, "A 1.5-V, 1.5-GHz CMOS low noise amplifier," IEEE J. of Solid-State Circuits, vol. 32, no. 5, May 1997, pp. 745-759.

Figure 3:
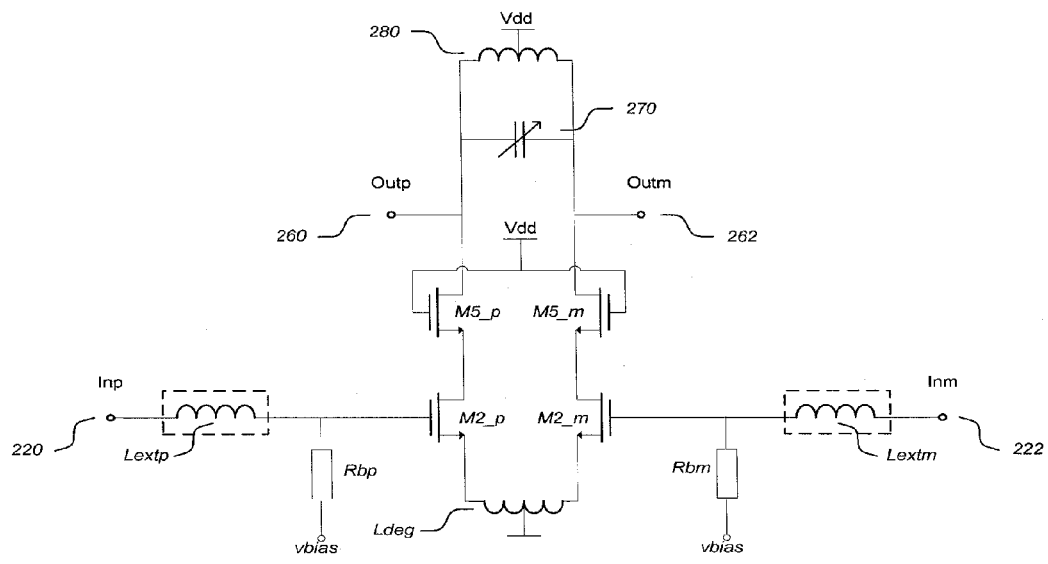
FIG. 3 is a circuit diagram of an inductively degenerated low noise amplifier according to the prior art.

An exemplary inductively degenerated LNA circuit is depicted in FIG. 3. The LNA of FIG. 3 is a differential amplifier, where transistors M2_p and M5_p form the positive or 'plus' side of the differential amplifier, and transistors M2_m and M5_m form the negative or 'minus' side of the differential amplifier. The plus and minus sides of the differential amplifier are each arranged in a cascode configuration, where transistors M2_p and M2_m, each arranged in a common source configuration, form the gain transistors of the plus and minus sides, respectively, and transistors M5_p and M5_m form the cascode transistors (or current cascodes) of the plus and minus sides, respectively. In this case, each of transistors M2_p, M2_m, M5_p, M5_m is an enhancement mode n-channel metal-oxide-semiconductor field-effect transistor (MOSFET) (also referred to as 'NMOS').

The differential amplifier amplifies the difference between the two input signals inp, inm applied to its input terminals 220 and 222, where the signal applied to input terminal 222 is a signal having the same magnitude as the signal applied to input terminal 220 but being 180 degrees out of phase with that signal (i.e. the signals have opposite phase). The differential amplifier is capable of rejecting signal components common to both its input signals whilst amplifying the difference between the two signals. The degree to which the differential amplifier rejects signal components common to both its input signals whilst amplifying the difference between the two signals can be measured by the Common-Mode Rejection Ratio (CMRR) metric.

The gate terminal of gain transistor M2_p on the plus side of the amplifier is connected to a bias voltage source vbias via a first bias resistor Rbp. The gate terminal of gain transistor M2_p is also connected to an external matching component Lextp. Input terminal 220 is connected to external matching component Lextp. External matching component Lextp is located on a separate circuit or device to the circuit containing the LNA of FIG. 3, i.e. matching component Lextp is 'off-chip' (denoted by dashed surrounding box in FIG. 3). In this case, matching component Lextp is an inductor.

Similarly on the minus side of the amplifier, the gate terminal of gain transistor M2_m is connected to bias voltage source vbias via a second bias resistor Rbm. The gate terminal of gain transistor M2_p is also connected to an external matching component Lextm. Input terminal 222 is connected to external matching component Lextm. Again, matching component Lextm is located off-chip, and in this case is an inductor.

The gate terminals of gain transistors M2_p and M2_m thus each form an input terminal of their respective gain transistor. The source and drain terminals of gain transistors M2_p and M2_m therefore form output terminals of the gain transistors.

The source terminal of each of the two gain transistors M2_p and M2_m is connected to a different respective terminal of an inductor Ldeg. Inductor Ldeg is a centre-tap differential inductor device with mutual coupling. Inductor Ldeg provides inductive degeneration of the source terminals of the two gain transistors M2_p and M2_m. The centre-tap terminal of inductor Ldeg is connected to ground.

The drain terminal of gain transistor M2_p on the plus side of the differential amplifier is connected to the source terminal of cascode transistor M5_p. Similarly, the drain terminal of gain transistor M2_m on the minus side of the differential amplifier is connected to the source terminal of cascode transistor M5_m.

The gate terminals of cascode transistors M5_p and M5_m are both connected to the circuit voltage supply Vdd (a DC voltage). Note that a gate terminal DC voltage can be set to a level other than Vdd, such that the drain voltage of gain transistor M2_p can be set to a desired level in order to increase the available voltage swing at the drain terminal of cascode transistor M5_p.

The drain terminals of cascode transistors M5_p and M5_m are connected to output terminals 260 and 262 respectively, where 260 is the output terminal of the plus side of the differential amplifier at which output signal outp is produced, and 262 is the output terminal of the minus side of the differential amplifier at which output signal outm is produced. The drain terminals of cascode transistors M5_p and M5_m are also each connected to the voltage supply Vdd via a configurable load; in this case the configurable load comprises an inductor 280 and variable capacitor 270 connected in parallel. Inductor 280 is a centre-tap differential inductor device and its centre-tap terminal is connected to voltage supply Vdd. The output terminals 260 and 262 of the LNA of FIG. 3 are thus connected to the configurable load.

The noise performance of the LNA topology depicted in FIG. 3 is typically dominated by the noise performance of gain transistors M2_p and M2_m and the input matching network. The noise performance can be improved by optimizing the input matching network (for example including gain transistors M2_p and M2_m and external matching components Lextp and Lextm). In this topology, the input matching network preceding the input transistors provides passive voltage gain which can be measured as a ratio of the voltage swing observed at the gate to source terminal junction of the corresponding gain transistor, e.g. M2_p, and the voltage swing at the LNA input. A high value for this ratio, known in this context as the Q-value of the input matching network, is beneficial in reducing the drain current noise of gain transistor M2_p, but it increases the induced gate current noise of the input transistor. However, the inductively degenerated LNA requires several off-chip external matching components Lextp and Lextm, and thus tends to be relatively expensive.

Embodiments involve an LNA topology that provides input impedance matching capabilities without requiring use of external input impedance matching components. This topology is referred to herein as a 'signal reusing' topology, the reasons for which will be explained below with reference to FIGS. 4 to 6.

The signal reusing LNA has wideband matching for differential as well as for common mode signals. Therefore, the good differential linearity is also retained for common mode signals. A further gain stage parallel to the input impedance matching stage increases the LNA gain. The amplified signal at the output of the input impedance matching stage is reused in order to decrease the noise contribution of the following transistors. In addition, the signal reusing LNA can be biased without the need for large-value AC-coupling capacitors at the LNA input. Due to the lack of passive voltage gain prior to the signal reusing LNA input stage, the noise figure is higher compared to an inductively degenerated LNA. Furthermore, there are additional noise sources in addition to gain transistor of M2_p,m. However, since the signal reusing LNA does not require external components nor an additional on-chip source inductor for input impedance matching, the overall cost is much smaller compared to an inductively degenerated LNA.

The signal reusing topology provides a cost-efficient solution. Certain exemplary embodiments of this disclosure achieve high gain and therefore reduce the noise contribution of processing stages following an LNA. This can be seen when applying Friis' equation given above: the noise factors for subsequent components are divided by the power gain of a preceding LNA. Certain exemplary embodiments of differential LNA provide good input impedance matching over a wide bandwidth for differential as well as for common-mode signals, which in turn results in good common-mode linearity. An LNA according to some embodiments has compensation for temperature, process, corner, and ageing effects and offers no restrictions when choosing an interface to mixer and analogue baseband components. In some configurations, the LNA removes the need for direct current (DC)-coupling capacitors for input transistor devices, which leads to a smaller die area being used when compared to prior art LNAs.

Figure 4:
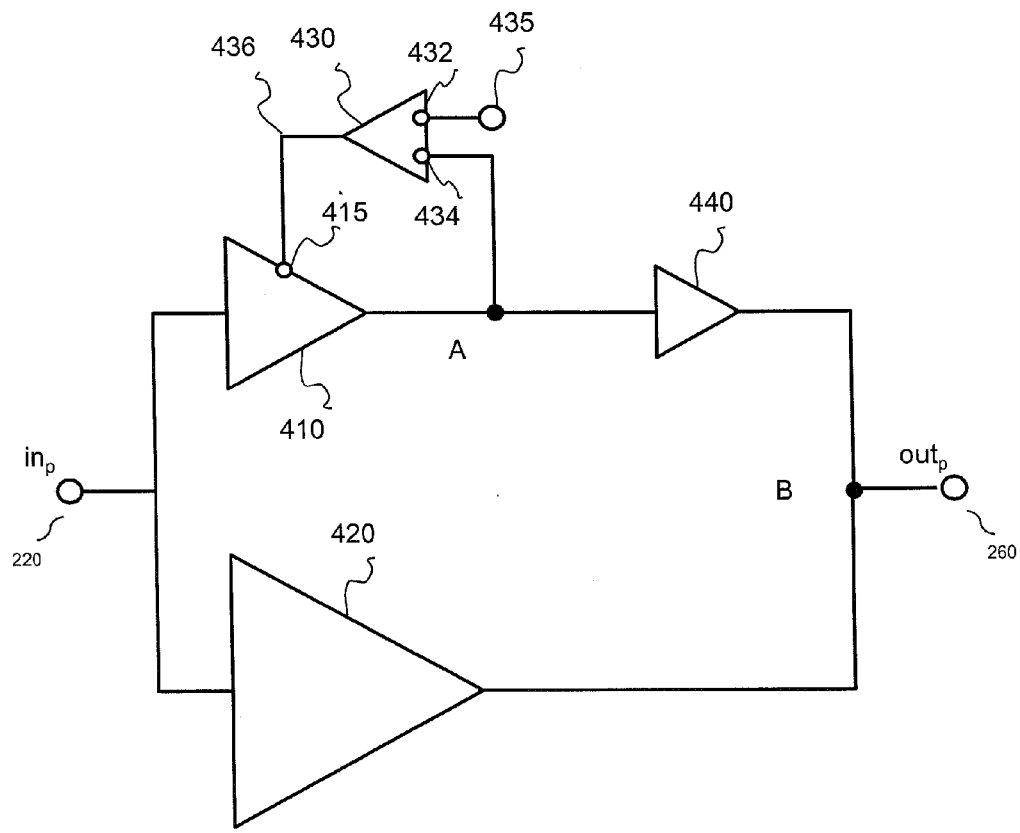
FIG. 4 is a block diagram of a signal reusing low noise amplifier according to embodiments.

FIG. 4 shows a schematic illustration of one or more stages in one of the sides of a differential amplifier of a signal reusing LNA according to embodiments. Certain features of the differential amplifier are omitted, such as a coupling to a further side of the differential amplifier and ground, to better demonstrate the conceptual aspects of the embodiments. The terms "couple" and "electrically couple" refer to a direct or indirect electrical connection between two components. If a first component is coupled to a second component this may be through a direct connection, e.g. an electrical trace or wire, or via one or more further components, e.g. one or more components or stages may be provided upon an electrical trace between the first and second components.

The stages shown in FIG. 4 have a signal inp applied at input terminal 220. The input terminal is coupled to an impedance matching stage 410. The impedance matching stage 410 acts to match an input impedance seen at the input terminal 220. For example, one or more components of the impedance matching stage 410 may have a combined impedance that matches any impedance of receiver processing stages upstream of the LNA such as a front-end module, RF filter, duplex filter, etc.

The input terminal 220 is further electrically coupled to a gain stage 420, i.e. the impedance matching stage 410 and the gain stage 420 are both coupled in parallel to the input terminal 220. Having a gain stage 420 in parallel with the impedance matching stage 410 increases the gain of the LNA. As approximately illustrated by the relative size of the stages in FIG. 4, the gain of the gain stage 420 is greater than any gain provided by the impedance matching stage 410. Gain stage 420 is coupled to the output terminal 260 at which output signal outp is produced.

The output of the impedance matching stage 410 (node A) is coupled to a feedback stage 430. The output of the impedance matching stage 410 also contributes to the output outp of the system, in the present example, via a second gain, signal processing or signal reuse stage 440. In other embodiments, the impedance matching stage 410 may be coupled to the output terminal 260 without signal reuse stage 440, for example via other components that maintain a high impedance at node A, such that the LNA still provides adequate impedance matching. In the example of FIG. 4, the outputs of the signal reuse stage 440 and the gain stage 420 are combined to produce output signal outp. This may be achieved by coupling the outputs of both stages at node B so that two output current signals are constructively combined. In some embodiments, both the gain stage 420 and the signal reuse stage share the same DC current path thus optimising the current consumption of the LNA.

By coupling the output of the impedance matching stage 410 to the output terminal 260, e.g. via signal reuse stage 440, it may be said that the result of the impedance matching stage 410 is "reused", i.e. is subsequently used to produce the output of the amplifier, in the present example via a further gain stage. For example, the impedance matching functionality of the impedance matching stage 410 could be provided without electrically coupling the impedance matching stage 410 to the output terminal 260, e.g. without any coupling between node A and node B. In certain embodiments, the reuse of a signal that has been processed, and in some cases amplified, by the impedance matching stage 410 decreases noise contributions, i.e. contributions to the noise factor, provided by one or more transistors than implement the LNA. For example, amplification provided by the impedance matching stage 410 decreases the noise contribution of following stages in the LNA, e.g. amongst other, current buffer or load stages. In certain embodiments, a current buffer stage (not shown) may be provided before the output, i.e. between node B and output terminal 260. This buffer stage may buffer the current signal from the gain stage 420 and the signal reuse stage 440. In a differential embodiment, the conceptual features of FIG. 4 are typically replicated in a second, minus side of the differential amplifier for input signal inm In some embodiments, the impedance matching stage 410 uses feedback stage 430. In the example of FIG. 4, the feedback stage 430 comprises a feedback amplifier, however other functionally similar feedback arrangements with or without gain may be used in other implementations. In FIG. 4, the output of the impedance matching stage 410, which may comprise a current and voltage at point A, is coupled to an inverting input 434 of the feedback amplifier.

Figure 5:
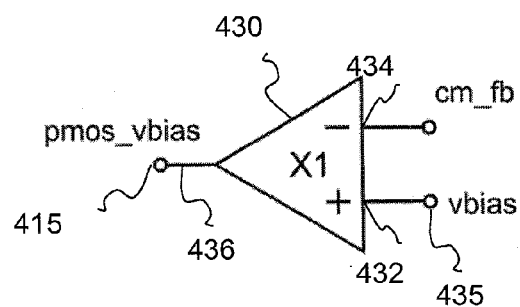
FIG. 5 illustrates a common-mode feedback amplifier according to embodiments.

One embodiment of the feedback amplifier (labelled X1 in figure) is shown in more detail in FIG. 5. The non-inverting input 432 of the amplifier is coupled to a voltage source 435, which provides a configurable voltage bias, vbias. The voltage bias vbias may be an internally or externally created bias voltage (from the perspective of an integrated LNA). It may be generated using a resistor and a constant current for example. It may also use a proportional to absolute temperature (PTAT) current or voltage reference to accommodate changes in temperature. The output 436 of the feedback stage 430 is coupled to a voltage bias 415 for the impedance matching stage 410, i.e. a voltage that is used to set an operating point for the impedance matching stage 410. Hence, the feedback provided by feedback stage 430, in use and over time, sets the (DC) voltage at node A to the applied voltage bias vbias. For example, this may be achieved in steady state operation.

In certain embodiments, the voltage at node A defines an input bias voltage for the impedance matching stage 410 and the gain stage 420 (see description of FIG. 6 below). This has the advantage of avoiding the use of any AC-coupling capacitors and bias resistors to bias the input voltages of stages 410 and 420, thus reducing the cost and size of an integrated LNA. The feedback stage 430 compensates for temperature and corner variations in one or more transistor devices that make up the LNA, such as transistors that implement the impedance matching stage 410. By changing the voltage bias 415 of at least the impedance matching stage 410 the LNA can compensate for corner effects and ageing. This is important in mass-produced circuits (i.e. mass produced LNAs) where the circuits need to be robust to compensate for variation inherent in the mass production process. The feedback stage 430 also improves productivity by enabling configuration of the LNA to optimise performance, e.g. by compensating for at least one of corner, temperature, and ageing variations that can reduce performance. By using the feedback stage, an input bias voltage for the impedance matching state 410 and the gain stage 420 can be provided without large value alternating current (AC) coupling capacitors or bias resistors at the input to the LNA being required. As large value AC coupling capacitors are typically of a large size, this further avoids the need for a large die area. In addition, the lack of bias resistors results in a better noise factor performance in blocking conditions.

FIG. 5 shows an implementation of feedback stage 430 that is, for example, suitable for use in the LNA of FIG. 6 described below. This implementation uses a feedback amplifier X1 to provide common-mode feedback functionality. The non-inverting input 432 of amplifier X1 is coupled to a voltage source, for example source 435 in FIG. 4, which provides the configurable voltage bias, vbias. The output 436 of the feedback stage 430 is coupled to a voltage bias 415 for a PMOS (P-channel metal-oxide-semiconductor field-effect transistor, PMOS being shorthand for P-MOSFET) transistor that implements impedance matching stage 410, hence it is labelled as a PMOS voltage bias pmos_vbias in FIG. 5. The PMOS voltage bias pmos_vbias and the common-mode feedback input cm_fb may be coupled to the equivalent point in FIG. 6, as described below. The common-mode feedback circuit X1 compensates for temperature and corner variations in one or more transistor devices that make up the LNA, such as NMOS transistors. By changing the PMOS voltage bias pmos_vbias, a NMOS/PMOS ratio can be kept constant across different temperature, ageing and process effects. As described above, this offers a more robust solution.

A specific circuit implementation of an embodiment of the disclosure will now be described with reference to FIG. 6. It should be noted that variations to the LNA may be possible while retaining the same functional effects, for example, one resistor could be replaced with two resistors in series or components could be rearranged while still maintaining an equivalent electrical circuit. Hence, the specific circuit implementation of FIG. 6 should not be seen as limiting.

Figure 6:
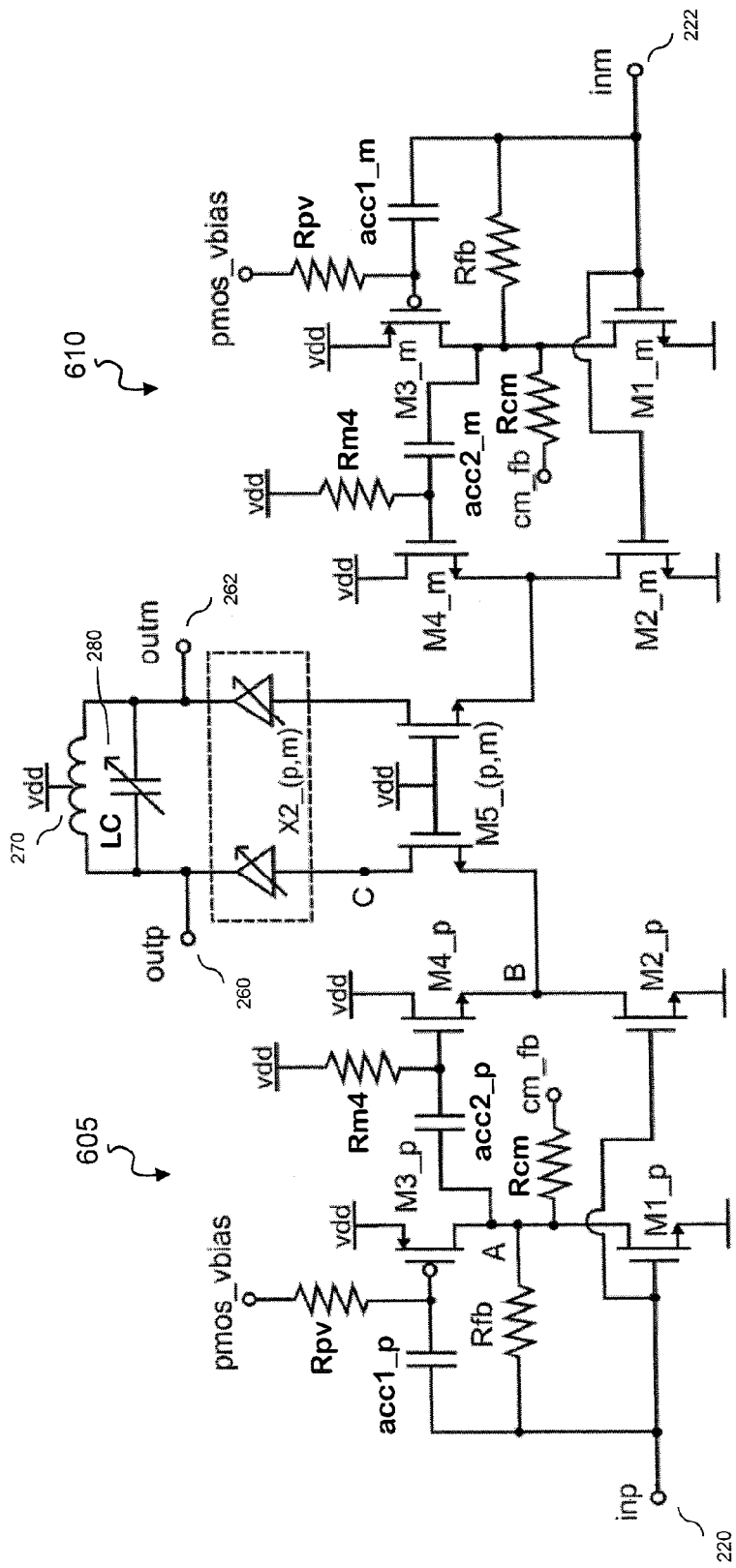
FIG. 6 is a circuit diagram of a signal reusing low noise amplifier according to embodiments.

The LNA circuit of FIG. 6 has two sides, 605 and 610, which together form a differential amplifier. Differential side 605 is arranged to process input signal inp provided at terminal 220 whereas differential side 610 is arranged to process input signal inm provided at terminal 222. Differential side 605 produces an output signal outp at output terminal 260 and differential side 610 produces an output signal outm at output terminal 262. The topology of FIG. 6 is symmetrical, i.e. the configuration of the first differential side 605 is replicated in the second differential side 610. The first differential side 605 may relate to a non-inverting, "plus" or positive side and the second differential side 610 may relate to an inverting, "minus" or negative side of an LNA (or vice versa). In the description below only the first differential side 605 will be discussed in detail, but the functionality equally applies to the corresponding second differential side 610. In certain embodiments, the functionality of the first differential side may alternatively be implemented without the second differential side to provide a single-ended amplifier.

In FIG. 6, an impedance matching stage, such as stage 410 in FIG. 4, is implemented by transistors M1_p and M3_p and feedback resistor Rfb. In this example, transistor M1_p is an NMOS transistor and transistor M3_p is a PMOS transistor. Transistors M1_p and M3_p form a feedback portion of the LNA. The gate terminal of transistor M1_p is coupled to input terminal 220. The source terminal of transistor M1_p is coupled to ground. The drain terminal of transistor M1_p is coupled to the drain terminal of transistor M3_p via node A. The source terminal of transistor M3_p is coupled to voltage supply vdd. The gate terminal of transistor M3_p is coupled to input terminal 220 via AC coupling capacitor acc1_p and is also coupled to pmos_vbias, a PMOS voltage bias provided by feedback amplifier X1, via a resistor Rpv. AC coupling capacitor acc1_p enables an AC signal to pass through from input terminal 220 to the gate of transistor M3_p but blocks any DC component so as to isolate the DC voltage bias seen at the gate of transistor M3_p from that seen at the gate of transistor M1_p. This enables the DC voltage bias seen at the gate of the transistor M3_p to be set by pmos_vbias. In this example, applying the PMOS voltage bias pmos_vbias to the gate of PMOS transistor M3_13 implements the application of a voltage bias to impedance matching stage 410 as described above with regard to FIG. 4.

Resistor Rpv acts to separate the two differential sides 605 and 610 (i.e. p and m). Without this resistor in each differential side, the PMOS gates of each differential side would short-circuit via the gate connections of M3_p and M3_m. In the example of FIG. 6, pmos_vbias is coupled to the output pmos_vbias of amplifier X1 as shown in FIG. 5. The same pmos_vbias is also applied to the other differential side, i.e. both pmos_vbias nodes are coupled to the pmos_vbias output of feedback amplifier X1. To provide their AC coupling function, the AC coupling capacitor acc1_p need only have a small capacitance, for example less than 1 pF. This minimises the parasitic capacitance at critical nodes with the circuit and minimises the cost and die area required by circuit capacitors.

The transconductances of devices M1_p and M3_p with feedback resistor Rfb match the input impedance of the LNA shown in FIG. 6 to a desired source impedance. For example, in certain implementations this input impedance may be 100 ohms differential, 50 ohms single-ended. Node A may be considered to be the output of an impedance matching stage implemented by transistors M1_p and M3_p and feedback resistor Rib. Node A is also coupled to the common-mode feedback input cm_fb of amplifier X1 as shown in FIG. 5 via resistor Rcm. Any voltage signal at node A is sensed using resistor Rcm without interfering with any AC signal present at node A. This then provides a voltage input signal cm_fb for feedback amplifier X1 as shown in FIG. 5. As described above, a voltage bias vbias is applied to amplifier X1. Feedback amplifier X1, which implements common-mode feedback stage 430, acts to modify the PMOS voltage bias signal pmos_vbias that biases PMOS transistor M3_p (e.g. sets the operating point for the transistor by setting the voltage at the gate of the transistor) such that, in use, the voltage at node cm_fb equals the voltage bias vbias. As the voltage at node A defines the input bias voltage for M1_p, and the input bias voltage for gain transistor M2_p as described below, the input bias voltages for the impedance matching stage 410 and the gain stage 420 are, in this example, based on vbias.

In FIG. 6, a gain stage is implemented by gain transistor M2_p in differential side 605 and gain transistor M2_m in differential side 610. In FIG. 6, these transistors are NMOS transistors. The gate terminal of gain transistor M2_p is coupled to the input terminal 220. Hence, the gate terminal is subject to a (DC) voltage bias as set by the voltage at point A and feedback resistor Rfb, i.e. the same voltage bias set for transistor M1_p. The source terminal of gain transistor M2_p is coupled to ground. The drain terminal of gain transistor M2_p is coupled to node B. By providing an input bias voltage for transistors M1_p and M2_p, which in the present example respectively implement the impedance matching stage 410 and the gain stage 420, using the voltage at node A, the use of bias resistors and/or AC-coupling capacitors to bias (i.e. provide a bias input voltage for the gates of) M1_p and M2_p can be avoided. This not only reduces the cost and size of an integrated LNA but it avoids adding to the noise factor of the LNA as discussed above.

In FIG. 6, a signal reuse stage is implemented by transistor M4_p. The source terminal of transistor M4_p is also coupled to node B. A gate terminal of transistor M4_p is coupled to voltage supply vdd via resistor Rm4. In other embodiments, the voltage bias for transistor M4_p could be replaced with an alternate bias voltage, for example a proportion of vdd such as 0.75*vdd. Typically, the gate voltage bias, vdd in this case, is selected such that transistor M4_p operates as a linear amplifier. The gate terminal of transistor M4_p is further coupled to node A via AC coupling capacitor acc2_p. Again, capacitor acc2_p need only be small, e.g. <1 pF, so as to isolate the DC voltage bias applied to the gate terminal of transistor M4_p from the DC voltage of node A but so as to allow AC signal components to pass and be amplified by transistor M4_p. In this way, a signal reuse stage implemented by M4_p, acc2_p, and Rm4 buffers a voltage signal at point A to a current signal input to point B. As can be seen from FIG. 6, each differential side only requires a minimum of two AC coupling capacitors which reduces costs and the required die area.

As well as providing an impedance matching function, by its arrangement the impedance matching stage further amplifies the input signal inp, i.e. acts as a constant transconductance (gm) amplifier, to produce an amplified (AC) signal at node A. This amplified signal is "reused" in the first gain stage. In FIG. 6, the amplified signal at node A is applied to the gate terminal of transistor M4_p, which further amplifies the signal to produce a further amplified signal at node B with high current and low noise characteristics. In other comparative examples, node A need not be coupled to a further portion of differential side 605, i.e. the impedance matching function could be achieved without the coupling of node A and the gate terminal of transistor M4_p. However, certain embodiments use ("reuse" when considering a first use as part of the impedance matching function) the signal at node A to provide better LNA performance. In certain alternative embodiments, another form of coupling other than a buffer or amplifying transistor may be used such that the signal at A is reused at B.

In FIG. 6 a current cascode or current buffer stage is implemented by transistor M5_p. In FIG. 6, transistor M5_p is an NMOS transistor. A source terminal of transistor M5_p is electrically coupled to node B. A drain terminal of transistor M5_p is electrically coupled to node C. A gate terminal of transistor M5_p is coupled to voltage supply vdd (as well as a gate terminal of transistor M5_m, which forms part of the second differential side 610). For sufficient performance, the gate bias voltage of transistor M5_m should follow the gate bias voltage of transistor M4_m. For example, if the voltage bias for transistor M4_p were replaced with an alternate bias voltage, such as 0.75*vdd, the voltage bias for transistor M5_m should also be replaced with alternate bias voltage (e.g. 0.75*vdd). Node C is at least coupled to output terminal 260 and a tuneable LC resonator 270, 280. The tuneable LC resonator implements a configurable load that is at least electrically coupled to both drain terminals of transistors M5_p, m. It comprises a variable capacitor in parallel with a centre-tap differential inductor; the centre-tap differential inductor is electrically coupled to the voltage supply vdd.

Note that a gate terminal DC voltage for transistors M5_p,m can be set to a level other than vdd, such that the drain voltage of gain transistor M2_p can be set to a desired level in order to increase the available voltage swing at the drain terminal of transistor M5_p. If the gate terminal DC voltage for transistors M5_p,m is to be changed, it is recommended to also change the gate terminal DC voltage for transistor M4_p accordingly, so as to maintain sufficient performance characteristics. In some implementations, a current steering cascode X2 may be provided between the drain terminal of each of transistors M5_p,m and the tuneable LC resonator/each output. A current steering cascode may be used to add gain control between M5_p and the output terminal 260 or to provide further current buffering if this is required.

In FIG. 6, transistors M5_p and M2_p are thus arranged in a cascode configuration, with M2_p providing a common source amplifier and M5_p providing a common gate amplifier. M2_p further shares a common DC current path with both M4_p and M5_p. Transistor M2_p has the largest transconductance (and the highest drain current) of the NMOS transistors. The signal currents though transistors M4_p and M2_p are added constructively at point B which increases the current gain. Node B thus outputs from the gain stage a high signal current with low noise to the cascode or buffer stage, which is then fed as a current through the M5_p cascode transistor, which is in turn followed by the tuneable LC resonator 270, 280.

At least resistors Rem, Rpv, and Rm4 have large values, i.e. values with an order of magnitude around 10 kOhms. The exact values of the resistors, and the capacitors, described herein may be selected using standard design practices, based on implementation specifications.

By reusing a signal generated as part of an impedance matching stage, the current consumption of the LNA can be reduced.

Certain embodiments described herein provide an advantage of achieving good noise performance, i.e. having a low noise factor, without external matching components. Certain embodiments also have a low current consumption, for example when compared with known resistive feedback LNAs. They can be fully integrated differential amplifier on a single chip. By suitably biasing gain and impedance matching stages, in particular transistors implementing those stages, at least one of accurate gain, linearity, noise, and input impedance matching may be achieved despite at least one of differing manufacturing processes, temperature effects, variations in supply voltage and aging conditions. Certain embodiments enable the transconductances of MOSFET devices to be accurately set to mitigate the aforementioned variations. In one embodiment this is achieved by biasing transistors M1 and M2 using resistive feedback and a DC bias point set with a constant transconductance circuit and a common-mode feedback stage. The use of at least the resistive feedback further avoids the need to use additional DC-biasing resistors to bias voltages seen by transistors M1 and M2. A topology described herein minimises the number of biasing resistors and AC-coupling capacitors, such that costs and die area, i.e. the area taken up by an integrated chip on a substrate, are minimised. This makes certain embodiments attractive for implementations requiring a number of LNA for different frequency bands.

Certain LNA embodiments presented herein provide common-mode matching and good common-mode linearity. They further provide wideband input impedance matching, i.e. impedance matching across a wide range of RF signal frequencies. This wideband matching occurs without the need for specific frequency calibration. For example, the topology of FIG. 6 is capable of matching frequencies in the range 0 to 3 GHz. This is due to there being an absence of frequency selecting components in the topology and the lack of any inductors as a source load, as for example is found with an inductively degenerated LNA. This results in better attenuation against far away signal blockers such as transmitters, wireless networks and Bluetooth signals, as for example compared to known resistive feedback LNAs. Wideband matching further avoids degradation of duplex filter performance, which may occur if the impedance matching does not occur over the frequency range processed by the duplex filter. It also avoids desensitising of a receiver front end and intermodulation products.

The topology of the signal reusing LNA of FIG. 6 bears some similarity to that of the inductively degenerated LNA of FIG. 3; however, there are several differences as follows:

Firstly, no inductor Ldeg, which provides inductive degeneration of the source terminals of gain transistors M2_p,m in the inductively degenerated LNA of FIG. 3, is present in the signal reusing LNA of FIG. 6. Instead, the source terminals of input transistors M2_p,m of the gain stage of the signal reusing LNA of FIG. 6 are connected directly to ground.

Secondly, output terminal 260, i.e. the output terminal of the plus side of the differential amplifier, is connected to input terminal 220, i.e. the input of the plus side of the differential amplifier, via input impedance matching, feedback and signal reusing stages. The minus side of the differential amplifier is similarly connected.

Thirdly, no external matching components Lextp and Lextm are provided in the signal reusing LNA of FIG. 6. Input transistors M2_p,m are thus directly connected to input terminals 220 and 222, respectively.

Rather than requiring external matching components in order to match the impedance to which the input terminals 220 and 222 are connected (where the impedance to be matched to is for example the output impedance of an RF filter preceding the LNA), the signal reusing LNA of FIG. 6 is capable of matching the impedance connected to input 220 and 222 internally within the LNA.

There are no external matching components Lextp and Lextm present in the signal reusing LNA of FIG. 6 that provide a passive voltage gain prior to transistors M1_p,m, M2_p,m, as described above for the inductively degenerated LNA of FIG. 3, so the noise effects of gain transistors M2_p, m are not mitigated. In addition, there are additional noise sources in the signal reusing LNA of FIG. 6 between the output terminals 260 and 262 and input terminals 220 and 222 of the LNA.

In general, the noise performance of the signal reusing LNA of FIG. 6 is worse compared to the inductively degenerated LNA of FIG. 3. However, since the signal reusing LNA of FIG. 6 does not require external matching components Lextp and Lextm, nor inductor Ldeg for inductive degeneration, the overall cost of the signal reusing LNA of FIG. 6 is lower compared to that of the inductively degenerated LNA of FIG. 3.

Some embodiments relate to an LNA circuit that can be configured between one of a first topology in which the low noise amplifier circuit comprises a degeneration inductance such that the low noise amplifier circuit operates as an inductively degenerated low noise amplifier, and a second topology, referred to herein as a signal reusing topology.

The signal reusing topology comprises an impedance matching stage coupled to an input of the configurable low noise amplifier circuit and a feedback stage coupled to an output of the impedance matching stage and a voltage source. The output of the impedance matching stage provides an input bias voltage for the impedance matching stage. The feedback circuit provides a compensated operating voltage for the impedance matching stage.

In the first topology, external matching components are used in conjunction with the LNA for input impedance matching purposes. In the second topology, input impedance matching is carried out using components internal to the LNA topology; no external matching components are required in the second topology. Input impedance matching may for example involve matching to the output impedance of an RF filter connected to one or more inputs of the LNA.

Figure 7:
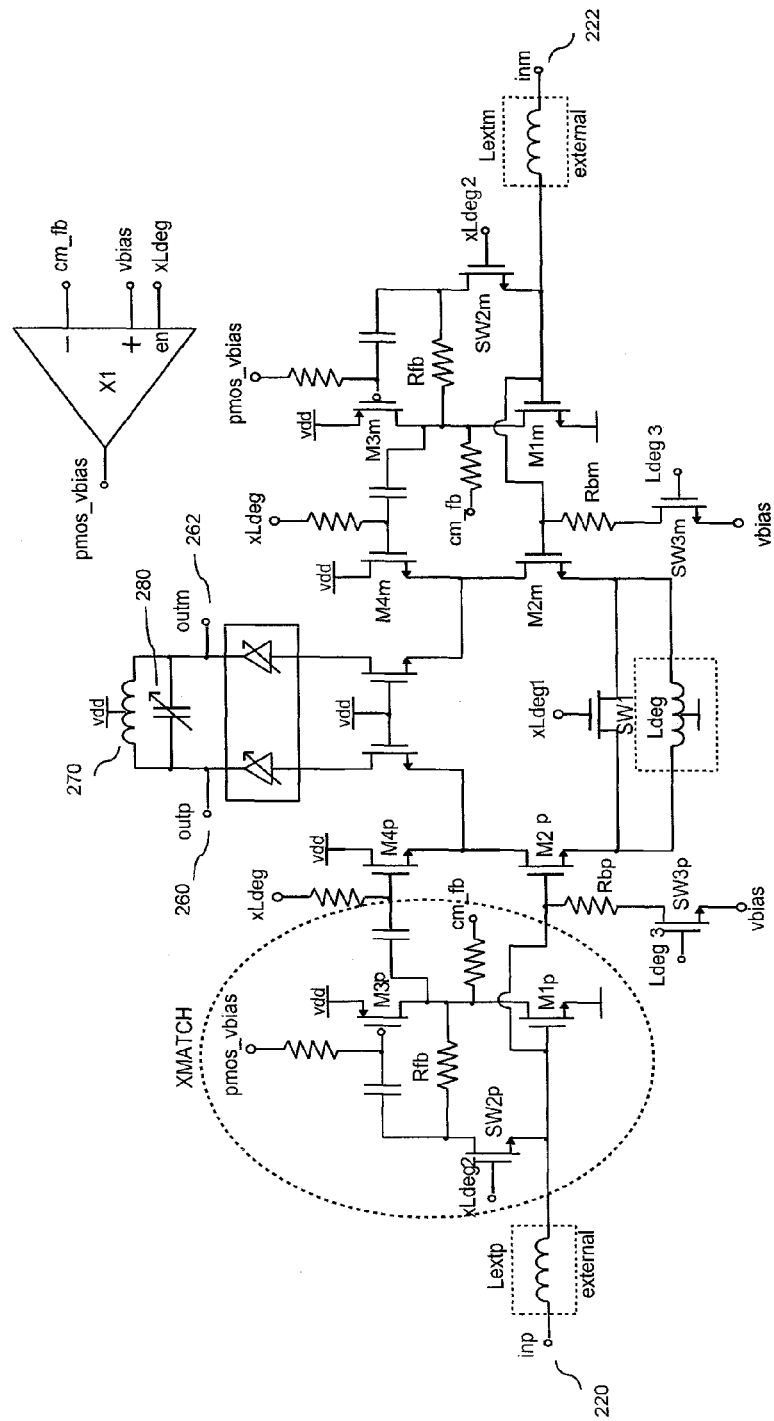
FIG. 7 is a circuit diagram of a configurable low noise amplifier according to embodiments.

An exemplary configurable LNA circuit according to embodiments is illustrated in FIG. 7. As with the LNAs of FIG. 3 and FIG. 6, the exemplary LNA of FIG. 7 is a differential amplifier; other embodiments may equally apply to a non-differential amplifier.

The topology of the configurable LNA of FIG. 7 necessarily contains some similar features to both the inductively degenerated low noise amplifier of FIG. 3 and the signal reusing LNA of FIG. 6; however, there are several important differences which include the following:

Firstly, the configurable LNA of FIG. 7 contains a switching arrangement for configuring the LNA between one of the first inductively degenerated topology and the second, signal reusing topology. The switching arrangement comprises a number of topology switching functions.

Secondly, similarly to the signal reusing LNA of FIG. 6, the configurable LNA of FIG. 7 includes input impedance stage 410, feedback stage 430 and signal reusing stage 440. However, rather than input impedance matching stage 410 on the plus side of the differential amplifier being connected directly to input terminal 220, input impedance matching stage 410 is connected to a topology switching function, in this case switching transistor SW2p, that is in turn connected to input terminal 220. Specifically, the drain terminal of switching transistor SW2p is connected to feedback resistor Rfb and AC coupling capacitor acc1_p, whilst the source terminal is connected to input terminal 220. The gate terminal of switching transistor SW2p is connected to a configuration control signal terminal xLdeg2. Topology switching function SW2p is thus connected between the gate of transistor M1_p and feedback resistor Rib and AC coupling capacitor acc1_p. The minus side of the differential amplifier is similarly connected with a topology switching function SW2m connected to the gate of transistor M1_m.

Thirdly, a topology switching function, in this case a switching transistor SW1, is connected between the source terminals of gain transistors M2_p and M2_m. One of the drain terminal and source terminal of switching transistor SW1 is connected to the source terminal of M2_p, whilst the other terminal is connected to the source terminal of M2_m. The gate terminal of switching transistor SW1 is connected to a configuration control signal terminal xLdeg1.

Fourthly, rather than the gate terminal of gain transistor M2_p on the plus side of the differential amplifier being directly connected to a bias voltage source vbias via a first bias resistor Rbp, a topology switching function, in this case a switching transistor SW3p, is connected between the first bias resistor Rbp and the bias voltage source vbias. Specifically, the drain terminal of switching transistor SW3p is connected to Rbp, whilst the source terminal is connected to vbias. Similarly, on the minus side of the differential amplifier a topology switching function, in this case a switching transistor SW3m, is connected between the second bias resistor Rbm and the bias voltage source vbias.

By applying appropriate configuration control signals to configuration control terminals xLdeg1, xLdeg 2 and Ldeg 3, switching transistors SW1, SW2p,m can be switched to an open state and SW3p,m can be switched to a closed state, whereby the configurable LNA of FIG. 7 is configured in the first, inductively degenerated topology. Conversely, by applying appropriate configuration control signals to configuration control terminals xLdeg1, xLdeg 2 and Ldeg 3, switching transistors SW1, SW2p,m can be switched to a closed state and SW3*p,m* can be switched to an open state, whereby the configurable LNA of FIG. 7 is configured in the second, signal reusing topology.

The configurable low noise amplifier can be configured between the first and second topologies by using a switching arrangement. The switching arrangement comprises a number of topology switching functions, which in embodiments comprise switching transistors.

In the first inductively degenerated topology, switching transistors SW1 and SW2*p,m* are configured to an open state and switching transistors SW3*p,m* are configured to a closed state.

When in an open state, a switching transistor provides a high resistance between its drain and source terminals which effectively disconnects (or 'open-circuits') the drain and source terminals. A switching transistor may be placed in the open state by applying an appropriate control signal to the respective configuration control signal terminal such that the voltage between the gate terminal and the source terminal (i.e. the voltage $V_{gs}$) of the switching transistor is less (or approximately less) than the threshold voltage (i.e. the voltage $V_t$) of the switching transistor, i.e. a switching transistor may thus be described as being in cutoff mode. A configuration control signal for configuring a switching transistor into an open state may for example comprise a digital '0' signal (such as a signal comprising a first voltage level).

When in a closed state, a switching transistor provides a low resistance between its drain and source terminals which effectively connects (or 'short-circuits') the drain and source terminals. A switching transistor can be placed in the closed state by applying a configuration control signal to its control signal terminal such that the voltage between the gate terminal and the source terminal (i.e. the voltage $V_{gs}$) of the switching transistors is greater than the threshold voltage (i.e. the voltage $V_t$) of the switching transistor, i.e. a switching transistor may thus be described as being in triode mode. A configuration control signal for configuring a switching transistor into a closed state may for example comprise a digital '1' (such as a signal comprising a second voltage level)

By configuring switching transistors SW2*p* to an open state, this prevents current flowing through transistors M1_p,m. This means that the impedance matching stage 410 of each side of the differential amplifier is effectively disconnected from the input signals inp, inm applied to respective input terminals 220 and 222.

Switching transistors SW3*p,m* are configured to a closed state by application of an appropriate control signal Ldeg3 in order to apply the bias voltage vbias directly to the gates of gain transistors M2_p,m.

The configurable low noise amplifier circuit is configurable in the first topology by coupling the output of feedback amplifier X1 of feedback stage 430 on both the plus and minus sides of the differential amplifier to the positive supply voltage vdd in order to close the M3_p,m transistors. In embodiments, since the feedback amplifier X1 is not in use in the first topology, the common mode feedback amplifier X1 on both the plus and minus sides of the differential amplifier is disabled by connecting its enable input to an appropriate control signal.

The configurable low noise amplifier circuit is configurable in the first topology by closing the signal reusing M4_p,m transistors. This can be achieved by applying an appropriate control signal to the gates of the M4_p,m transistors, for example a relatively low control signal compared to when the configurable low noise amplifier circuit is configured in the second topology.

Figure 8:
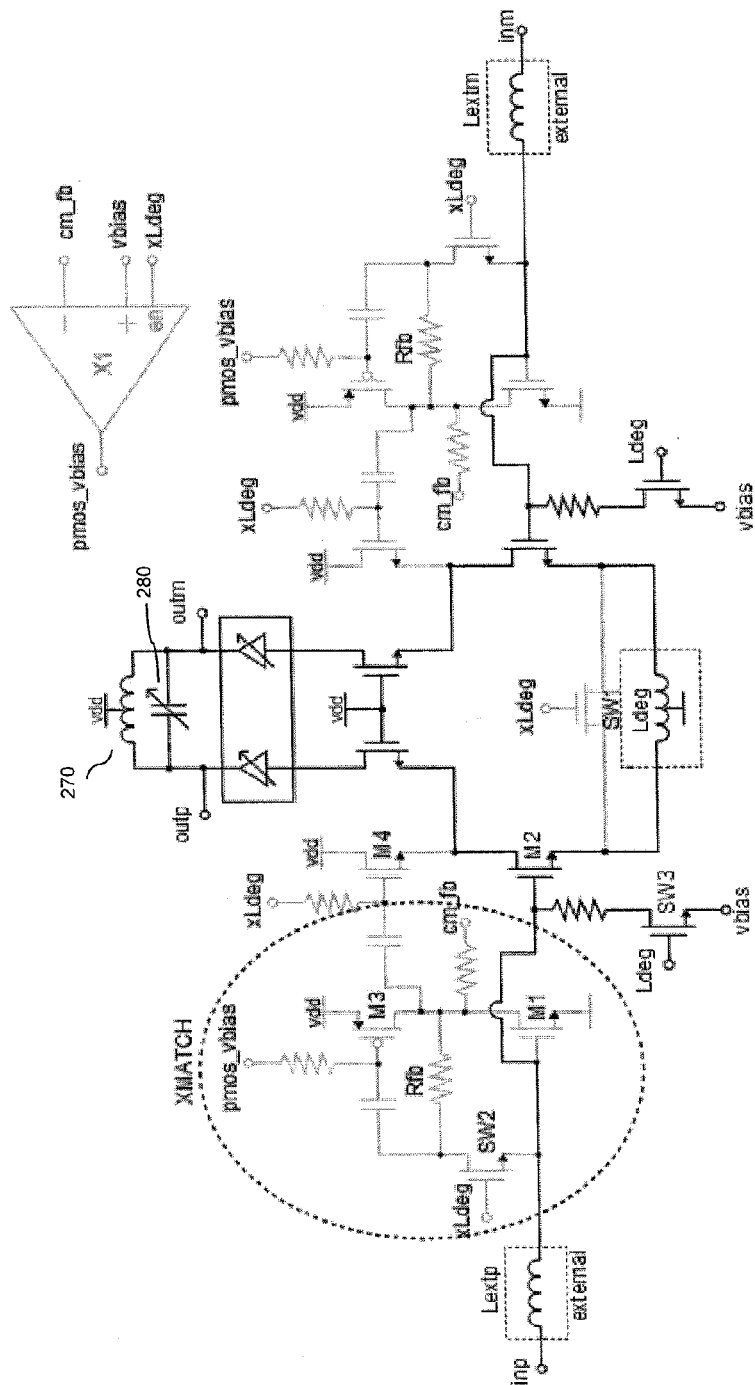
FIG. 8 is a circuit diagram of a configurable low noise amplifier configured in an inductively degenerated topology according to embodiments.

This configuration mode is depicted in FIG. 8. Transistors M1_p,m, M3*p,m* and M4*p,m* are closed and therefore not affecting the circuit operation (such components being shown in grey instead of black in FIG. 8). In addition, the common mode feedback of feedback amplifier X1 is disabled and the bias resistors Rpv and Rcm connected to X1 in addition to resistor Rfb have no effect on the operation of the configurable low noise amplifier. Since in this configuration the input impedance matching stage (denoted XMATCH in FIGS. 7 and 8) is disabled, input impedance matching is achieved using external matching components Lextp and Lextm.

By configuring switching transistor SW1 to an open state, the source terminals of input transistors M2*p,m* are effectively connected only via inductor Ldeg, whose centre-tap is connected to ground. Inductor Ldeg therefore provides inductive degeneration of the source terminals of input transistors M2*p,m*, as in the inductively degenerated LNA of FIG. 3.

The configurable LNA thus operates as an inductively degenerated LNA when switching transistors SW1 and SW2*p,m* are configured to an open state and switching transistors SW3*p,m* are configured to a closed state, i.e. when the configurable LNA is configured in the first topology.

Therefore, when configured in the first topology, the configurable LNA does not provide internal input impedance matching, for example matching to the output impedance of a preceding RF filter connected to input terminals 220 and 222. As a result, the input impedance of the configurable LNA of FIG. 8 should be matched, for example to a preceding RF filter, by connecting external impedance matching components, for example external matching components Lextp and Lextm as depicted in the inductively degenerated LNA of FIG. 3.

The first topology of the configurable LNA of FIG. 7 thus provides the benefits of the inductively degenerated LNA of FIG. 3, i.e. relatively low noise figure, but requires the use of external matching components in order to provide input impedance matching.

In the second, signal reusing topology, switching transistors SW1 and SW2*p,m* are configured to a closed state and switching transistors SW3*p,m* are configured to an open state. In this operation mode, input impedance matching stage 410 and feedback stage 430 (collectively denoted XMATCH in FIG. 7) and signal coupling stage 440 are connected such that the circuit operation is identical to that of the signal reusing LNA depicted in FIG. 6. Input impedance matching is achieved (via XMATCH) without use of any external matching components such as Lextp and Lextm.

In embodiments, the configurable low noise amplifier circuit is configurable in the second topology by decoupling the output of feedback amplifier X1 of feedback stage 430 on both the plus and minus sides of the differential amplifier from the positive supply voltage vdd such that the M3_p,m transistors are open. Further, the common mode feedback amplifier X1 on both the plus and minus sides of the differential amplifier is enabled by application of an appropriate control signal to its enable input.

The configurable low noise amplifier circuit is configurable in the second topology by opening the signal reusing M4_p,m transistors. This can be achieved by applying an appropriate control signal to the gates of the M4_p,m transistors, for example a relatively high control signal compared to when the configurable low noise amplifier circuit is configured in the first topology.

When configured in the second topology, the configurable LNA provides internal input impedance matching, for example matching to the output impedance of a preceding RF filter connected to input terminals 220 and 222. As a result, external matching components, for example external matching components Lextp and Lexpm as depicted in the inductively degenerated LNA of FIG. 3, are not required.

When the configurable LNA of FIG. 7 is configured in the second topology, switching transistor SW1 is configured to a closed state; this provides additional benefits, as will now be described.

By configuring switching transistor SW1 to a closed state, the source terminals of gain transistors M2_p,m are effectively connected (i.e. short-circuited). The connection formed by switching transistor SW1 between the source terminals of gain transistors M2_p,m is in parallel to inductor Ldeg which connects the source terminals of gain transistors M2_p,m.

As in the inductively degenerated LNA of FIG. 3, inductor Ldeg is a differential inductor device with mutual coupling. The mutual coupling of the differential inductor device causes the inductor to operate differently for common-mode signals applied to the differential amplifier, compared to differential-mode signals applied to the differential amplifier.

Common-mode signals applied to the differential amplifier are signal components that have the same magnitude and same phase in the respective input signals inp, inm applied to input terminals 220 and 222. In contrast, differential-mode signals are signal components that have the same magnitude and opposite phase in the respective input signals applied to input terminals 220 and 222.

For differential-mode signals that are applied to the input terminals 220 and 222, when the configurable LNA is configured in the second topology, the connection formed by switching transistor SW1 between the source terminals of input transistors M2p,m forms a virtual ground for the differential signal.

However in relation to common-mode signals that are applied to the input terminals 220 and 222, when the configurable LNA is configured in the second topology, inductor Ldeg remains active, providing an inductance equivalent to:

$$(1-k)/2 * L_n \qquad (2)$$

between the source terminals of gain transistors M2_p,m and ground (which is connected to the centre-tap of inductor Ldeg), where k is the mutual coupling coefficient of inductor Ldeg, and $L_n$ is a nominal inductance based on the electrical length of inductor Ldeg.

Thus, when the configurable LNA is configured in the second topology, the inductance provided by inductor Ldeg (as per equation (3) above) forms an impedance that serves to attenuate interference and other noise from the ground voltage supply. The power supply noise rejection performance, for example as demonstrated by a higher Power Supply Rejection Ratio (PSRR) metric, of the configurable LNA when configured in the second topology is thus improved. The degeneration inductance provided by inductor Ldeg is thus adapted to provide a power supply noise rejection impedance when the configurable LNA is configured in the second topology.

The configurable LNA enables an improvement in the PSRR in a signal reusing LNA topology by 'borrowing' the inductor Ldeg from the inductively degenerated LNA topology. The 'borrowing' of inductor Ldeg also ensures that an expensive (in terms of chip area) on-chip component from the first topology of the configurable LNA can be used in both configurations of the configurable LNA.

Additionally, when the configurable LNA is configured in the second topology, the inductance provided by inductor Ldeg (as per equation (3) above) in relation to common-mode signals forms a degeneration inductor for the source terminals of gain transistors M2_m,p. As described above in relation to the inductively degenerated LNA of FIG. 2, such a degeneration inductor serves to improve the common-mode rejection performance, for example as demonstrated by a higher CMRR metric, of the configurable LNA when configured in the second topology. The degeneration inductance provided by inductor Ldeg is thus adapted to provide a common-mode signal rejection impedance in relation to signal components common to input signals applied to input terminals 220 and 222 when the configurable LNA is configured in the second topology.

The configurable LNA enables an improvement in the CMRR in a signal reusing LNA topology by 'borrowing' the inductor Ldeg from the inductively degenerated LNA of FIG. 3. The 'borrowing' of the inductor Ldeg also ensures that an expensive (in terms of chip area) on-chip component from the first topology of the configurable LNA can be used in both configurations of the configurable LNA.

The configurable LNA of FIG. 7 thus provides an LNA that can be configured according to the desired use case or design requirements.

The LNA can be configured in the first topology if a more sensitive LNA with a better noise figure is required, at the cost of a need for external matching components, e.g. Lextp and Lextm, in order to provide impedance matching for the inputs of the configurable LNA.

Alternatively, the LNA can be configured in the second topology in order to provide a more cost effective solution.

Additionally, when the configurable LNA is configured in the second topology, the use of inductor Ldeg provides an improvement in the PSRR and CMRR of the LNA over the signal reusing LNA of FIG. 6. This results in the re-use of an expensive on-chip component (i.e. inductor Ldeg) that can consume a significant amount of chip area of the configurable LNA.

The configurable LNA may be configured by its manufacturer, or by a third party installing the configurable LNA, for example in a device or module thereof; this may involve a method of configuring the LNA that comprises applying either a first set of one or more control signals to the LNA to configure it in the first topology or a second set of one or more control signals to the LNA to configure it in the second topology. A set of control signals may for example be applied to one or more of the switching transistors.

The configurable LNA of FIG. 7 can be implemented in a radio-frequency semiconductor integrated circuit (RFIC). Such an RFIC may be included in an RF module comprising an RF filter located in an RF Front End Module preceding the LNA. The RFIC may comprise input and output pins that may be used to connect external matching components between the configurable LNA and the RF filter. An RFIC could alternatively comprise one or more RF filters connected to one or more configurable LNAs.

The configurable LNA of FIG. 7 can be incorporated in a number of different devices. Such a device could comprise a user equipment such as a mobile station, personal digital assistant or cellular telephony device etc.; the configurable LNA may for example be included in a receiver of such a user equipment. Further, such a device could comprise a modem device to be attached to a user equipment, for example a Universal Serial Bus (USB) modem. Still further, such a device could comprise a communication module such as a Machine-to-Machine (M2M) module which can be inserted into another device such as a laptop computer or other device with communication capability (for example a vending machine). Yet, still further, such a device could comprise a chipset which may include radio and baseband parts.

In embodiments, the configurable low noise amplifier circuit comprises a common output terminal at which the output of the configurable low noise amplifier circuit is provided when configured in either said first topology or said second topology. For example, in the case of a non-differential amplifier such as only the positive side of the configurable low noise amplifier of FIG. 7 being employed, the output of the circuit when configured in the first topology is produced at output terminal 260 and the output of the circuit when configured in the second topology is also produced at output terminal 260. Such re-use of a single output terminal for both topologies provides a lower cost solution both for the configurable LNA itself and other components connecting to it than a solution requiring multiple output terminals. Similarly, a single, common, pair of output terminals can be employed for the case of a differential amplifier, rather than multiple pairs of output terminals for different configurations.

Embodiments involve a method of manufacturing a low noise amplifier circuit comprising a gain stage coupled to the input of the low noise amplifier circuit, the method comprising:

providing a low noise amplifier circuit which is configurable between one of a first topology in which the low noise amplifier circuit comprises a degeneration inductance whereby the low noise amplifier circuit operates as an inductively degenerated low noise amplifier; and providing a second topology in which the low noise amplifier circuit comprises an impedance matching stage coupled to an input of the configurable low noise amplifier circuit, the output of the impedance matching stage providing an input bias voltage for the impedance matching stage, and a feedback stage coupled to an output of the impedance matching stage and a voltage source, the feedback stage providing a compensated operating voltage for the impedance matching stage.

The above embodiments are to be understood as illustrative examples. Further embodiments are envisaged, some examples of which follow here.

In embodiments, switching transistor SW1 can be configured in an open state in the second, signal reusing topology which can help in decreasing the parasitic effect of gain transistors M2_p,m.

It will be understood that the circuitry referred to herein may in practice be provided by a single chip or integrated circuit that implements an analogue circuit design. In other embodiments the circuitry may alternatively be implemented by plural chips or integrated circuits, optionally provided as a chipset, an application-specific integrated circuit (ASIC), field-programmable gate array (FPGA), etc. The chip or chips may comprise circuitry (as well as possibly firmware) for embodying radio frequency circuitry, which are configurable so as to operate in accordance with the exemplary embodiments. In this regard, the exemplary embodiments may be implemented at least in part by computer software stored in memory and executable by the processor, or by hardware, or by a combination of tangibly stored software and hardware (and tangibly stored firmware).

In embodiments, the transistors M3_p,m can be replaced with alternative load components, such as resistors. The LC resonator may also be replaced with an alternative load.

Although the term "in parallel" has been used therein the skilled person would understand that a variety of buffering components could be used to delay and/or synchronise various signal paths as described herein.

In a first alternative arrangement, cascode transistors M5_p,m are not included in the configurable LNA circuit of FIG. 7. In such an arrangement, on the plus side of the differential amplifier, the drain terminal of gain transistor M2_p is connected to output terminal 260 of the configurable LNA and to the configurable load (e.g. inductor 270 and variable capacitor 280) that is connected to the voltage supply Vdd. Similarly, on the minus side of the differential amplifier, the drain terminal of gain transistor M2_m is connected to output terminal 262 of the configurable LNA and to the configurable load that is connected to the voltage supply Vdd. The omission of the cascode transistors M5_p,m may degrade the input-output isolation of the invention and worsen the Miller effect of the configurable LNA; however such an arrangement still benefits from the other advantages of the configurable LNA of FIG. 7 described above.

In a second alternative arrangement, only one side of the differential amplifier is included in the configurable LNA circuit of FIG. 7, for example either the plus side or the minus side. In such an arrangement only one input terminal 220 and only one output terminal 260 are included in the configurable LNA circuit. Additionally, degeneration inductor Ldeg is connected between the source terminal of gain transistor M2$p$ of the configurable LNA and ground. Finally, the source and drain terminals of switching transistor SW1 are connected such that when SW1 is in a closed state, the source terminal of gain transistor M2$p$ is effectively connected to ground. This arrangement thus does not comprise a differential amplifier and does not benefit from the common-mode rejection capabilities of a differential amplifier; however such an arrangement still benefits from the other advantages of the configurable LNA of FIG. 7 described above.

In a yet further alternative embodiment, switching transistor SW1 is not included in the configurable LNA circuit. In such an embodiment, inductor Ldeg remains in circuit for both the first and second topologies of the configurable LNA.

Different types of topology switching functions may be used with any of the embodiments described above. For example, as opposed to n-type enhancement mode MOSFETs, p-type and/or depletion mode MOSFETs may be used. In another example, bipolar junction transistors may be used.

In further alternative embodiments, topology switching functions other than switching transistors can be employed, for example mechanical switches which can be physically switched to configure the configurable LNA in the desired topology.

In another further alternative embodiment, inductor Ldeg may not be a differential inductor with centre tap connected to ground, but instead may be replaced by two inductors. In this case, the first of these inductors connects between the source terminal of gain transistor M2_p (on the plus side of the differential amplifier) and ground, and the second of these inductors connects between the source terminal of gain transistor M2_m (on the minus side of the differential amplifier) and ground.

The configurable load, e.g. resonator load formed by inductor 270 and variable capacitor 280, may be removed from the circuit or alternatively replaced with another impedance such as a non-resonator load, wideband load, active load etc.

In a yet further alternative embodiment, the applied configuration control signals may be provided by an RFIC containing the configurable LNA of FIG. 7. For example, one or more topology switching functions may be used to connect one or more configuration control terminals to an appropriate voltage supply (e.g. Vdd for one configuration and ground for another configuration) of the RFIC, in order to configure the LNA in either the first topology or the second topology. In another example, one or more non-volatile memory devices may be configured to provide the configuration control signals, for example the output of a static random access memory (SRAM) device, flash memory device or Electrically Erasable Programmable Read-Only Memory (EEPROM) device may provide the configuration control signals. Such a non-volatile memory device could be externally programmed to store appropriate data (e.g. a '0' bit or a '1' bit) in order to allow the memory device to provide configuration control signals that configure the LNA in either the first topology or the second topology. The method of configuring the LNA may in this case include applying a set of control signals to the LNA by programming the above non-volatile memory device appropriately.

In a further embodiment, since the input matching network of the configurable LNA gives passive gain in the inductively degenerated topology, the current consumption in the inductively degenerated topology can be smaller than in the signal reusing topology. This means that different bias points for input transistors or alternate transistor sizes can be used in the different topology configurations to trade-off between current consumption and performance.

The configurable LNA of the embodiments described above may be used, amongst other implementations, in wireless devices. "Wireless devices", as used herein, includes in general any device capable of connecting wirelessly to a network, and includes in particular mobile devices including mobile or cell phones (including so-called "smart phones"), personal digital assistants, pagers, tablet and laptop computers, content-consumption or generation devices (for music and/or video for example), etc., as well as fixed or more static devices, such as personal computers, game consoles and other generally static entertainment devices, various other domestic and non-domestic machines and devices, etc. The configurable LNA of the embodiments described above may also be used in any radio-frequency receiver, including those provided in network equipment such as network base stations, wireless routers, wireless sensors, wireless monitoring hardware or any device that communicates using a radio frequency connection. For example, the configurable LNA may operate with wireless systems using any of the frequency bands and/or protocols described above.

In accordance with given embodiments, there is provided a configurable low noise amplifier circuit comprising a gain stage coupled to the input of the low noise amplifier circuit, the low noise amplifier circuit being configurable between one of:

a first topology in which the low noise amplifier circuit comprises a degeneration inductance whereby the low noise amplifier circuit operates as an inductively degenerated low noise amplifier; and a second topology in which the low noise amplifier circuit comprises:

an impedance matching stage coupled to an input of the configurable low noise amplifier circuit, the output of the impedance matching stage providing an input bias voltage for the impedance matching stage; and a feedback stage coupled to an output of the impedance matching stage and a voltage source, the feedback stage providing a compensated operating voltage for the impedance matching stage.

Hence, provision of either inductively degenerated LNA functionality which requires external input impedance matching or LNA functionality which provides input impedance matching via a single LNA circuit is provided. Only a single instance of components common to both of the topologies is required and such component re-use helps to reduce the cost and die area.

In some embodiments, when configured in the second topology, the output of the impedance matching stage provides an input bias voltage for the gain stage.

By using an output, such as a voltage output, of the impedance matching stage to bias the inputs of the impedance matching stage and the gain stage in the second topology, a bias can be provided without alternating current (AC)-coupling capacitors and/or bias resistors. Such 'signal reuse' in the second topology can thus reduce the cost and/or size of an LNA and improves the noise factor performance. This arrangement in the second topology provides a first level of feedback from the output of the impedance matching stage to the input of the impedance matching stage.

A second level of feedback in the second topology is provided using a feedback stage, wherein the output of the feedback stage is used to set an operating voltage of the impedance matching stage based on a voltage source and an output of the impedance matching stage. This has the effect of compensating the operating voltage for the impedance matching stage for at least one of temperature, process, corner, and ageing effects resulting in more robust performance. As such, the configurable LNA is particularly suited to mass production.

In some embodiments, when configured in the second topology, an output of the gain stage and an output of the impedance matching stage are used to produce the output of the LNA circuit. Hence, in the second topology current consumption can be reduced by reusing a signal amplified by the impedance matching stage which also improves noise performance.

In some embodiments, the circuit comprises a switching arrangement, the circuit being configurable between one of the first topology and the second topology via the switching arrangement. Hence, the circuit can be configured according in the first or second topology according to the desired performance of the circuit.

In some embodiments, the switching arrangement comprises a first topology switching function connected between the other output of the gain stage and ground, and a second topology switching function adapted to provide the coupling between the impedance matching stage and the input of the configurable low noise amplifier circuit, and a third topology switching function connected between the input of the configurable low noise amplifier circuit and the voltage source, wherein the low noise amplifier circuit is configurable in the first topology by configuring the first and second topology switching functions in an open state and the third topology switching function in a closed state, and wherein the circuit is configurable in the second topology by configuring the first and second topology switching functions in a closed state and the third topology switching function in an open state. Hence, efficient configuration of the LNA circuit between the first and second topologies is provided.

In some embodiments, wherein the first and/or the second and/or the third topology switching functions comprise switching transistors, wherein each of the switching transistors is configurable in the open state via input of an open state configuration control signal to the input terminal of the respective switching transistor, and wherein each of the switching transistors is configurable in the closed state via input of a closed state configuration control signal to the input terminal of the respective switching transistor. Hence, the topology of the LNA circuit can be conveniently configured by applying appropriate control signals, for example digital control signals, to a number of switching transistors within the LNA circuit.

In some embodiments, the low noise amplifier circuit comprises one or more current cascodes located before the output of the low noise amplifier circuit. These allow a current signal to be buffered before being output by the amplifier. One or more current cascodes enable gain control to be added to the amplifier.

In some embodiments, the feedback stage comprises a feedback amplifier, wherein the output of the impedance matching stage is coupled to an inverting input of the feedback amplifier, wherein the voltage source is coupled to a non-inverting input of the feedback amplifier, and wherein an operating bias voltage for the impedance matching stage is set based on the output of the feedback amplifier. A feedback amplifier provides an efficient implementation of the feedback stage that maintains the cost and size benefits of the amplifier.

In some embodiments, the impedance matching stage comprises a feedback resistor coupled to the input of the low noise amplifier and a first node, a load component coupled to an output of the feedback stage and the first node, and a first NMOS transistor having a source, a gate and a drain, the gate being coupled to the input of the low noise amplifier circuit, the drain being coupled to the first node, the first node providing the output of the impedance matching stage. This arrangement provides an efficient implementation of the impedance matching stage. The feedback resistor provides a first level of feedback for setting the input bias voltages of the impedance matching and gain stages. The combined impedance of the feedback resistor, the load component and the first NMOS transistor matches the input impedance of the amplifier to desired source impedance. This arrangement may be implemented internally in an integrated LNA as it does not require components that occupy large silicon die area. No external matching components are required for the second topology which makes the configurable LNA particularly suited to mass production and use in wideband systems.

In some embodiments, the load component comprises a PMOS transistor having a source, a gate and a drain, the gate being coupled to the output of the feedback stage to provide an operating voltage for the impedance matching stage, the drain being coupled to the first node. A PMOS transistor is an efficient implementation of an operating voltage input of the impedance matching stage as by changing a gate bias voltage for the transistor via the feedback circuit, a NMOS/PMOS ratio can be kept constant across different temperature, ageing and process effects, providing a robust solution. The output of the feedback stage may be coupled to the gate of the PMOS transistor via a first resistor and the input of the feedback stage may be coupled to the first node via a second resistor. The resistors may have large resistance values, for example of the order of 10 k Ohms, which act to provide voltages for biasing the gate of the PMOS transistor and for an input to the feedback stage.

In some embodiments, the gate of the PMOS transistor is coupled to the input of the configurable low noise amplifier circuit via a first AC-coupling capacitor. This acts to isolate a DC bias voltage for the PMOS transistor from any voltage at the input, but acts to allow AC currents to pass thus enabling the impedance matching stage to amplify an AC signal that may contribute to the output of the amplifier.

In some embodiments, transconductances of the PMOS transistor and the first NMOS transistor and the resistance of the feedback resistor are selected to match a desired source impedance.

In some embodiments, the configurable low noise amplifier circuit is configurable in the first topology by coupling the output of the feedback stage to a positive supply voltage. Hence, the load component transistor is closed when the LNA circuit is configured in the first topology. In some embodiments, the feedback stage is disabled to reduce current consumption of the first topology by applying a suitable control signal to an enable input of the feedback stage.

In some embodiments, the gain stage comprises a second NMOS transistor having a source, a gate and a drain, the gate being coupled to the input of the low noise amplifier circuit, the drain comprising the output of the gain stage. Such an arrangement efficiently provides a high gain stage.

In some embodiments, when configured in the second topology, the low noise amplifier circuit comprises a signal coupling stage coupled to the output of the impedance matching stage and an output of the signal coupling stage is used together with the output of the gain stage to produce the output of the low noise amplifier circuit. In this arrangement the output of the impedance matching stage of the second topology, for example an AC signal, is processed before contributing to the output of the configurable low noise amplifier.

In some embodiments, the signal coupling stage comprises a third NMOS transistor having a source, a gate and a drain, the gate being coupled to the output of the impedance matching stage, the source being coupled to the output of the gain stage. The output of the impedance matching stage is amplified before being constructively added to the output of the gain stage, thus increasing the performance of the amplifier.

In some embodiments, the configurable low noise amplifier circuit is configurable in the first topology by applying a control signal to the gate of the third NMOS transistor to close the third NMOS transistor. Hence, AC current is desirably steered into one or more cascode transistors located before the output of the low noise amplifier circuit.

In some embodiments, the gate of the third NMOS transistor is coupled to a further voltage source via a third resistor to bias the gate, the gate being coupled to the output of the impedance matching stage via a second AC-coupling capacitor. This provides an efficient arrangement and the AC-coupling capacitor isolates the DC gate bias voltage from the voltage at the first node.

In some embodiments, when the low noise amplifier circuit is configured in the second topology, the degeneration inductance is adapted to provide a power supply noise rejection impedance. Hence, the degeneration inductance of the inductively degenerated low noise amplifier topology can be usefully employed in the second topology to counter noise effects of a power supply of the circuit.

In some embodiments, the circuit comprises a common output terminal at which the output of the configurable low noise amplifier circuit is provided when configured in either the first topology or the second topology. Re-use of a single output terminal for both topologies provides a lower cost solution for the configurable LNA and connections to components interfacing with the configurable LNA are simplified.

In some embodiments, the configurable low noise amplifier circuit comprises a differential amplifier, the stages forming one side of the differential amplifier. Certain embodiments are particularly suited to implementations that use differential signals, such as low noise amplifiers in radio-frequency communications systems.

In some embodiments, the degeneration inductance comprises a centre-tap differential degeneration inductor connected between respective gain stage outputs of each side of the differential amplifier. The first topology switching function may be connected between respective gain stage outputs of each side of the differential amplifier. Hence, a configurable differential amplifier having associated good common-mode rejection performance is provided.

In some embodiments, each side of the differential amplifier comprises a fourth topology switching function adapted to provide coupling between the impedance matching stage and input of the respective side of the differential amplifier of the configurable low noise amplifier circuit; and a fifth topology switching function connected between the input of the respective side of the differential amplifier of the configurable low noise amplifier circuit and the voltage source, wherein the low noise amplifier circuit is configurable in the first topology by configuring the first, second and fourth topology switching functions in an open state and the third and fifth topology switching functions in a closed state, and wherein the circuit is configurable in the second topology by configuring the first, second and fourth topology switching functions in a closed state and the third and fifth topology switching functions in an open state. Hence, both sides of the differential amplifier can be configured when switching between the first and second topologies.

In some embodiments, when the low noise amplifier circuit is configured in the second topology, the degeneration inductance is adapted to provide a common-mode signal rejection impedance in relation to signal components common to input signals for each side of the differential amplifier. Hence, the degeneration inductance of the inductively degenerated LNA topology can be usefully employed in the second topology to provide desirable common-mode signal rejection for a differential amplifier.

In accordance with embodiments, there is provided a radio-frequency semiconductor integrated circuit comprising one or more configurable low noise amplifier circuits according to the given embodiments.

In accordance with embodiments, there is provided a radio-frequency module comprising one or more radio-frequency filter circuits coupled to one or more configurable low noise amplifier circuits according to the given embodiments.

In accordance with embodiments, there is provided a device comprising a configurable low noise amplifier circuit according to the given embodiments.

In accordance with embodiments, there is provided a method of manufacturing a low noise amplifier circuit according to the given embodiments.

In accordance with embodiments, there is provided a method of configuring a low noise amplifier circuit comprising a gain stage, the method comprising applying one of:
  a first set of one or more control signals to the circuit to configure the circuit in a first topology in which the low noise amplifier circuit comprises a degeneration inductance whereby the low noise amplifier circuit operates as an inductively degenerated low noise amplifier; or
  a second set of one or more control signals to the circuit to configure the circuit in a second topology in which the low noise amplifier circuit comprises:
    an impedance matching stage coupled to an input of the configurable low noise amplifier circuit, the output of the impedance matching stage providing an input bias voltage for the impedance matching stage; and
    a feedback stage coupled to an output of the impedance matching stage and a voltage source, the feedback stage providing a compensated operating voltage for the impedance matching stage.

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. A configurable low noise amplifier circuit comprising a gain stage coupled to the input of the low noise amplifier circuit, said low noise amplifier circuit being configurable between one of:
  a first topology in which said low noise amplifier circuit comprises a degeneration inductance whereby said low noise amplifier circuit operates as an inductively degenerated low noise amplifier; and
  a second topology in which said low noise amplifier circuit comprises:
    an impedance matching stage coupled to an input of the configurable low noise amplifier circuit, the output of the impedance matching stage providing an input bias voltage for the impedance matching stage; and
    a feedback stage coupled to an output of the impedance matching stage and a voltage source, the feedback stage providing a compensated operating voltage for the impedance matching stage.

2. A configurable low noise amplifier circuit according to claim 1, wherein when configured in said second topology, the output of the impedance matching stage provides an input bias voltage for said gain stage.

3. A configurable low noise amplifier circuit according to claim 1, wherein when configured in said second topology, an output of the gain stage and an output of the impedance matching stage are used to produce the output of the low noise amplifier circuit.

4. A configurable low noise amplifier circuit according to claim 1, said circuit comprising a switching arrangement, said circuit being configurable between one of said first topology and said second topology via said switching arrangement.

5. A configurable low noise amplifier circuit according to claim 4, wherein said switching arrangement comprises:
  a first topology switching function connected between said other output of said gain stage and ground; and
  a second topology switching function adapted to provide said coupling between the impedance matching stage and the input of the configurable low noise amplifier circuit; and
  a third topology switching function connected between the input of the configurable low noise amplifier circuit and said voltage source,
  wherein said low noise amplifier circuit is configurable in said first topology by configuring said first and second topology switching functions in an open state and said third topology switching function in a closed state, and
  wherein said circuit is configurable in said second topology by configuring said first and second topology switching functions in a closed state and said third topology switching function in an open state.

6. A configurable low noise amplifier circuit according to claim 5, wherein said first and/or said second and/or said third topology switching functions comprise switching transistors,
  wherein each of said switching transistors is configurable in said open state via input of an open state configuration control signal to the input terminal of the respective switching transistor, and
  wherein each of said switching transistors is configurable in said closed state via input of a closed state configuration control signal to the input terminal of the respective switching transistor.

7. A configurable low noise amplifier circuit according to claim 1, said low noise amplifier circuit comprising one or more current cascodes located before the output of the low noise amplifier circuit.

8. A configurable low noise amplifier circuit according to claim 1, wherein said feedback stage comprises a feedback amplifier,
wherein the output of the impedance matching stage is coupled to an inverting input of the feedback amplifier,
wherein the voltage source is coupled to a non-inverting input of the feedback amplifier, and
wherein an operating bias voltage for the impedance matching stage is set based on the output of the feedback amplifier.

9. A configurable low noise amplifier circuit according to claim 1, wherein the impedance matching stage comprises:
a feedback resistor coupled to the input of the low noise amplifier and a first node;
a load component coupled to an output of the feedback stage and the first node; and
a first NMOS transistor having a source, a gate and a drain, the gate being coupled to the input of the low noise amplifier circuit, the drain being coupled to the first node, the first node providing the output of the impedance matching stage.

10. A configurable low noise amplifier circuit according to claim 9, wherein the load component comprises a PMOS transistor having a source, a gate and a drain, the gate being coupled to the output of the feedback stage to provide an operating voltage for the impedance matching stage, the drain being coupled to the first node.

11. A configurable low noise amplifier circuit according to claim 10, wherein the output of the feedback stage is coupled to the gate of the PMOS transistor via a first resistor and the input of the feedback stage is coupled to the first node via a second resistor.

12. A configurable low noise amplifier circuit according to claim 10 or 11, wherein the gate of the PMOS transistor is coupled to the input of the configurable low noise amplifier circuit via a first AC-coupling capacitor.

13. A configurable low noise amplifier circuit according to claim 10, wherein transconductances of the PMOS transistor and the first NMOS transistor and the resistance of the feedback resistor are selected to match a desired source impedance.

14. A configurable low noise amplifier circuit according to claim 1, wherein said configurable low noise amplifier circuit is configurable in said first topology by coupling the output of said feedback stage to a positive supply voltage.

15. A configurable low noise amplifier circuit according to claim 14, wherein said configurable low noise amplifier circuit is configurable in said first topology by applying a control signal to an enable input of said feedback stage to disable said feedback stage.

16. A configurable low noise amplifier circuit according to claim 1, wherein the gain stage comprises a second NMOS transistor having a source, a gate and a drain, the gate being coupled to the input of the low noise amplifier circuit, the drain comprising the output of the gain stage.

17. A configurable low noise amplifier circuit according to claim 1, wherein when configured in said second topology, said low noise amplifier circuit comprises a signal coupling stage coupled to the output of the impedance matching stage and an output of the signal coupling stage is used together with the output of the gain stage to produce the output of the low noise amplifier circuit.

18. A configurable low noise amplifier circuit according to claim 17, wherein the signal coupling stage comprises a third NMOS transistor having a source, a gate and a drain, the gate being coupled to the output of the impedance matching stage, the source being coupled to the output of the gain stage.

19. A configurable low noise amplifier circuit according to claim 18, wherein said configurable low noise amplifier circuit is configurable in said first topology by applying a control signal to the gate of said third NMOS transistor to close said third NMOS transistor.

20. A configurable low noise amplifier circuit according to claim 18 or 19, wherein the gate of the third NMOS transistor is coupled to a further voltage source via a third resistor to bias the gate, the gate being coupled to the output of the impedance matching stage via a second AC-coupling capacitor.

21. A configurable low noise amplifier circuit according to claim 1, wherein when said low noise amplifier circuit is configured in said second topology, said degeneration inductance is adapted to provide a power supply noise rejection impedance.

22. A configurable low noise amplifier circuit according to claim 1, wherein said circuit comprises a common output terminal at which the output of said configurable low noise amplifier circuit is provided when configured in either said first topology or said second topology.

23. A configurable low noise amplifier circuit according to claim 1, wherein said configurable low noise amplifier circuit comprises a differential amplifier, said stages forming one side of said differential amplifier.

24. A configurable low noise amplifier circuit according to claim 23, wherein said degeneration inductance comprises a centre-tap differential degeneration inductor connected between respective gain stage outputs of each side of said differential amplifier.

25. A configurable low noise amplifier circuit according to claim 23 or 24, wherein said first topology switching function is connected between respective gain stage outputs of each side of said differential amplifier.

26. A configurable low noise amplifier circuit according to claim 23, wherein each side of the differential amplifier comprises:
a fourth topology switching function adapted to provide coupling between the impedance matching stage and input of the respective side of said differential amplifier of the configurable low noise amplifier circuit; and
a fifth topology switching function connected between the input of the respective side of the differential amplifier of the configurable low noise amplifier circuit and said voltage source,
wherein said low noise amplifier circuit is configurable in said first topology by configuring said first, second and fourth topology switching functions in an open state and said third and fifth topology switching functions in a closed state, and
wherein said circuit is configurable in said second topology by configuring said first, second and fourth topology switching functions in a closed state and said third and fifth topology switching functions in an open state.

27. A configurable low noise amplifier circuit according to claim 23, wherein when said low noise amplifier circuit is configured in said second topology, said degeneration inductance is adapted to provide a common-mode signal rejection impedance in relation to signal components common to input signals for each side of said differential amplifier.

28. A radio-frequency semiconductor integrated circuit comprising one or more configurable low noise amplifier circuits according to claim 1.

29. A radio-frequency module comprising one or more radio-frequency filter circuits coupled to one or more configurable low noise amplifier circuits according to claim 1.

30. A device comprising a configurable low noise amplifier circuit according to claim 1.

31. A method of manufacturing a low noise amplifier circuit according to claim 1.

32. A method of configuring a low noise amplifier circuit comprising a gain stage, said method comprising applying one of:

a first set of one or more control signals to said circuit to configure said circuit in a first topology in which said low noise amplifier circuit comprises a degeneration inductance whereby said low noise amplifier circuit operates as an inductively degenerated low noise amplifier; or a second set of one or more control signals to said circuit to configure said circuit in a second topology in which said low noise amplifier circuit comprises:

an impedance matching stage coupled to an input of the configurable low noise amplifier circuit, the output of the impedance matching stage providing an input bias voltage for the impedance matching stage; and a feedback stage coupled to an output of the impedance matching stage and a voltage source, the feedback stage providing a compensated operating voltage for the impedance matching stage.

* * * * *

UNITED STATES PATENT AND TRADEMARK OFFICE
CERTIFICATE OF CORRECTION

PATENT NO. : 8,264,282 B1
APPLICATION NO. : 13/271566
DATED : September 11, 2011
INVENTOR(S) : Jonne Juhani Riekki Page 1 of 1

It is certified that error appears in the above-identified patent and that said Letters Patent is hereby corrected as shown below:

On the title page, item [56]:

Please insert the below references under "References Cited" heading:

--U.S. PATENT DOCUMENTS

| | | | |
|---|---|---|---|
| 7,323,939 | B2 | 01/2008 | Han et al. ............................ 330/311 |
| 7,679,436 | B2 | 03/2010 | Jimenez et al. ..................... 330/253 |
| 2006/0132242 | A1 | 06/2006 | Han et al. .......................... 330/311 |
| 2010/0328542 | A1 | 12/2010 | Kammula et al. ................. 330/253 |

FOREIGN PATENT DOCUMENTS

CN 101834576 9/2010

OTHER PUBLICATIONS

Combined Search and Examination Report under Sections 17 and 18(3) dated August 10, 2012 issued by the U.K. Patent Office in related U.K. Application GB 1206423.4.
Notice of Allowance and Notice of Allowability dated September 6, 2012 issued in U.S. Application Serial No. 13/556,552 by the U.S. Patent Office.
Communication (Patents Act of 1977: Entitlement to earlier date under Section 15(9) dated August 20, 2012, issued by the U.K. Patent Office in related U.K. Application GB1207237.7.
Chen, Che-Sheng, et al., "A 2.5GHz 90nm CMOS Triple Gain Mode LNA for WiMAX Applications," International Symposium on Signals, Systems and Electronics, ISSSE' 07, pages 367-369.--

Signed and Sealed this
Thirtieth Day of April, 2013

Teresa Stanek Rea
*Acting Director of the United States Patent and Trademark Office*